United States Patent
Wyant et al.

(10) Patent No.: US 12,394,671 B2
(45) Date of Patent: Aug. 19, 2025

(54) EFFICIENT REMOVAL OF STREET TEST DEVICES DURING WAFER DICING

(71) Applicant: TEXAS INSTRUMENTS INCORPORATED, Dallas, TX (US)

(72) Inventors: Michael Todd Wyant, Dallas, TX (US); Joseph Liu, Dallas, TX (US); Christopher Daniel Manack, Flower Mound, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 480 days.

(21) Appl. No.: 17/682,617

(22) Filed: Feb. 28, 2022

(65) Prior Publication Data
US 2023/0274978 A1    Aug. 31, 2023

(51) Int. Cl.
*H01L 21/66* (2006.01)
*H01L 21/78* (2006.01)
(Continued)

(52) U.S. Cl.
CPC .............. *H01L 21/78* (2013.01); *H01L 22/12* (2013.01); *H01L 23/31* (2013.01); *H01L 23/544* (2013.01); *H01L 22/34* (2013.01); *H01L 23/10* (2013.01)

(58) Field of Classification Search
CPC ... H01L 21/304; H01L 21/568; H01L 21/682; H01L 21/683; H01L 21/6835; H01L 21/6836; H01L 21/78; H01L 21/782; H01L 22/00; H01L 22/12; H01L 22/32; H01L 22/34; H01L 2221/67; H01L 2221/68327;
(Continued)

(56) References Cited

U.S. PATENT DOCUMENTS

| 5,668,019 A * | 9/1997 | Kobayashi ........ H01L 29/66757 438/164 |
| 8,643,147 B2 * | 2/2014 | Jeng ..................... H01L 23/562 257/750 |

(Continued)

*Primary Examiner* — Julio J Maldonado
*Assistant Examiner* — Paul A Berry
(74) *Attorney, Agent, or Firm* — Xiaotun Qiu; Frank D. Cimino

(57) ABSTRACT

In some examples, a method for manufacturing a semiconductor package comprises coupling a photoresist layer to a non-device side of a semiconductor wafer, the semiconductor wafer having a device side, first and second circuits formed in the device side and separated by a scribe street, a test device positioned in the scribe street. The method also comprises coupling a tape to the device side of the semiconductor wafer. The method also comprises performing a photolithographic process to form an opening in the photoresist layer and plasma etching through the semiconductor wafer by way of the opening in the photoresist layer to produce first and second semiconductor dies having the first and second circuits, respectively. The method also comprises removing the tape from device sides of the first and second semiconductor dies, wherein removing the tape includes removing the test device. The method also comprises coupling the first circuit of the first semiconductor die to a conductive member. The method also comprises covering the first semiconductor die with a mold compound, the conductive member exposed to an exterior surface of the mold compound.

15 Claims, 21 Drawing Sheets

(51) Int. Cl.
*H01L 23/31* (2006.01)
*H01L 23/544* (2006.01)
*H01L 23/10* (2006.01)

(58) Field of Classification Search
CPC ....... H01L 2221/6834; H01L 2223/544; H01L 2223/54453; H01L 2223/5446; H01L 2224/85; H01L 23/293; H01L 23/31; H01L 23/3107; H01L 23/49838; H01L 23/544; H01L 24/85; H01L 2223/5444; H01L 22/30; H01L 23/10; H01L 21/6386; H01S 5/0201; H10D 89/011–015
See application file for complete search history.

(56) References Cited

U.S. PATENT DOCUMENTS

| | | | |
|---|---|---|---|
| 8,742,547 B2* | 6/2014 | Yoshizawa | H01L 23/562 257/E21.705 |
| 10,515,853 B1* | 12/2019 | Chen | H01L 21/3065 |
| 2003/0164554 A1* | 9/2003 | Fee | H01L 23/49548 257/676 |
| 2005/0269702 A1* | 12/2005 | Otsuka | H01L 23/522 257/E21.582 |
| 2007/0264832 A1* | 11/2007 | Arita | H01L 21/78 438/700 |
| 2008/0128694 A1* | 6/2008 | Arita | H01L 21/78 257/E21.599 |
| 2012/0175340 A1* | 7/2012 | Misaki | H01L 21/76831 216/17 |
| 2019/0295894 A1* | 9/2019 | Okita | H01L 21/268 |

\* cited by examiner

EFFICIENT REMOVAL OF STREET TEST DEVICES DURING WAFER DICING

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wire-bonding technique, in which the device side of the semiconductor chip is oriented upward and is coupled to the conductive members using bond wires.

SUMMARY

In some examples, a method for manufacturing a semiconductor package comprises coupling a photoresist layer to a non-device side of a semiconductor wafer, the semiconductor wafer having a device side, first and second circuits formed in the device side and separated by a scribe street, a test device positioned in the scribe street. The method also comprises coupling a tape to the device side of the semiconductor wafer. The method also comprises performing a photolithographic process to form an opening in the photoresist layer and plasma etching through the semiconductor wafer by way of the opening in the photoresist layer to produce first and second semiconductor dies having the first and second circuits, respectively. The method also comprises removing the tape from device sides of the first and second semiconductor dies, wherein removing the tape includes removing the test device. The method also comprises coupling the first circuit of the first semiconductor die to a conductive member. The method also comprises covering the first semiconductor die with a mold compound, the conductive member exposed to an exterior surface of the mold compound.

In some examples a semiconductor package comprises a semiconductor die having a device side, a circuit formed in the device side, and a scribe seal coupled to the device side and, in a top-down view, circumscribing the circuit, the device side forming a ring that, in the top-down view, circumscribes the scribe seal and that is not covered by the circuit or by the scribe seal, the ring having a width ranging from 2 microns to 5 microns. The package also comprises a connector electrically coupling the circuit to a conductive member exposed to an exterior surface of a mold compound that covers the semiconductor die, the circuit, the scribe seal, and the ring.

DETAILED DESCRIPTION

Figure 1A:
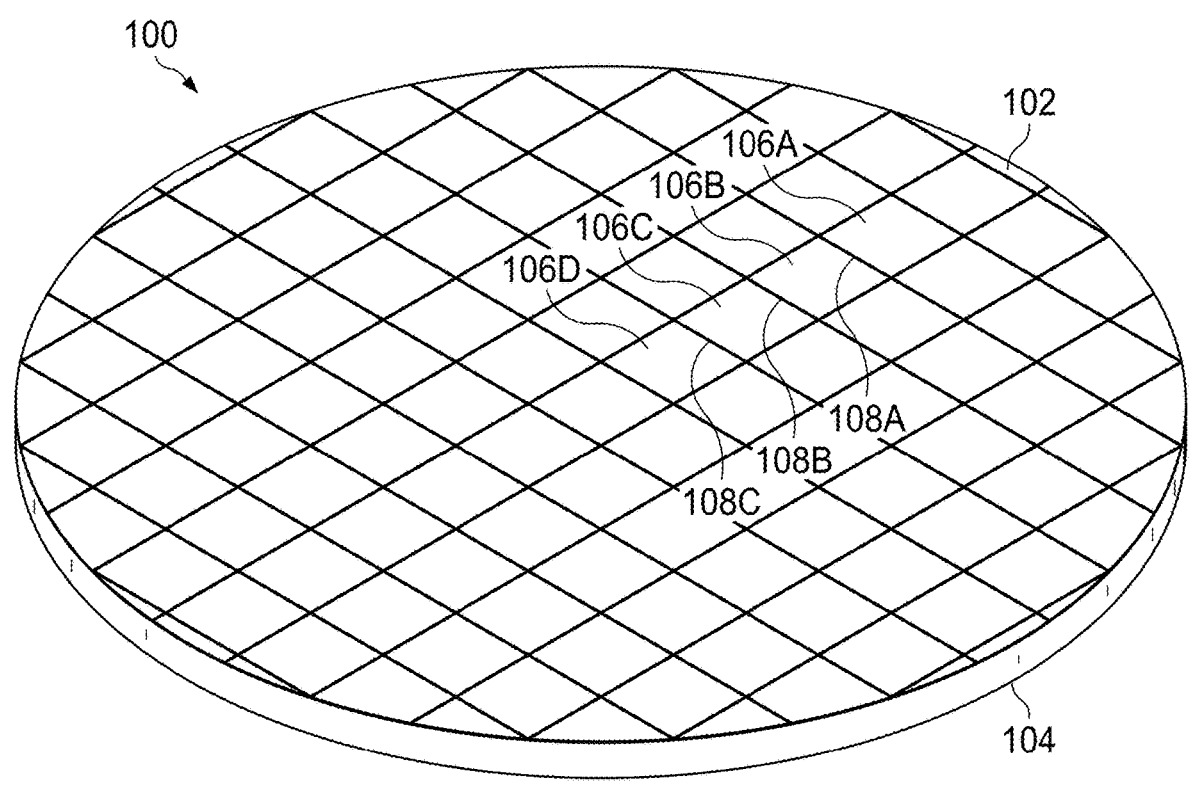
FIG. 1A is a perspective view of a semiconductor wafer having scribe streets, in accordance with various examples.

As described above, semiconductor packages include semiconductor dies. Semiconductor dies are formed by dicing semiconductor wafers, such as silicon or gallium nitride wafers. Numerous devices and techniques are useful for dicing semiconductor wafers, including cleaving, saw blades, laser ablation, stealth dicing, and plasma etching. Each of these approaches to wafer dicing has its disadvantages. For example, mechanical approaches such as cleaving and saw blade dicing tend to produce semiconductor dies of lower quality. Laser ablation produces semiconductor dies of reduced strength and poor sidewall quality. Stealth techniques introduce laser splash problems (e.g., the inadvertent distribution of laser light within a wafer and the resulting, unintended damage to the wafer), the control of which raises costs.

Plasma etching is advantageous because it mitigates mechanical and thermal stress on semiconductor wafers while producing deep and narrow vertical trenches, even in particularly thin wafers. However, certain types of semiconductor wafers can be difficult to plasma etch, especially wafers having test devices (e.g., for testing circuits formed on the wafers) in wafer scribe streets. For such wafers, the test devices are generally removed from the scribe streets through expensive and tedious techniques prior to plasma etching so that the plasma etching may be properly performed.

This disclosure describes various examples of a technique for manufacturing semiconductor packages. More particularly, this disclosure describes examples of a technique for plasma etching (e.g., dicing) semiconductor wafers to produce semiconductor dies that subsequently may be included in semiconductor packages. In examples, a photoresist layer is applied to a non-device side (e.g., a back side) of a semiconductor wafer. Photolithographic processes are performed to form openings in the photoresist layer that are vertically aligned with the scribe streets (and in some examples, with test devices in the scribe streets) of the semiconductor wafer. Plasma etching is then performed by way of the openings in the photoresist layer to form vertical etch trenches in the wafer. The trenches are vertically aligned with the scribe streets, and, in some examples, with the test devices in the scribe streets. In examples, the trenches are narrower than the scribe streets. In examples, the trenches are approximately the same width as the test devices in the scribe streets. Because the trenches are narrower than the scribe streets, when dicing is complete, a resulting semiconductor die will have a device side horizontal area that is larger than the horizontal area of the circuit formed in and on the device side of that die. Stated another way, in a top-down view, the device side of the semiconductor die will have a ring that circumscribes a scribe seal of the semiconductor die, and the scribe seal will circumscribe a circuit of the semiconductor die. The ring will have a width ranging from 2 microns to 5 microns. The presence of a ring of this width is sufficient—but not necessary—evidence that the wafer dicing techniques described herein have been used to dice a wafer.

During the wafer dicing process, a tape may be applied to the device side of the wafer (e.g., to hold the wafer in place during dicing). After dicing is complete, the tape may be removed. The tape is coupled to the test devices in the wafer scribe streets, and because the etch trenches formed during wafer dicing are vertically aligned with the test devices, the portions of the wafer coupled to the test devices are etched away. Thus, post-etching, the test devices are held in place only by the tape. Accordingly, removal of the tape also entails removal of the test devices coupled to the tape. In this way, when the tape is removed post-etching, the test devices are also removed, thereby providing an inexpensive and efficient manner of test device removal during the wafer dicing process. Furthermore, plasma wafer etching, which is advantageous for at least the reasons described above, is facilitated.

After a semiconductor die is formed using the wafer dicing process, the die is coupled to a die pad or thermal pad and is also coupled by connectors (e.g., using bond wires) to a conductive member (e.g., a lead or pin). A mold compound is applied to cover the semiconductor die. The conductive member is exposed to an exterior surface of the mold compound. In this manner, a semiconductor package is formed using the inexpensive and efficient wafer dicing techniques described herein.

Figure 9A:
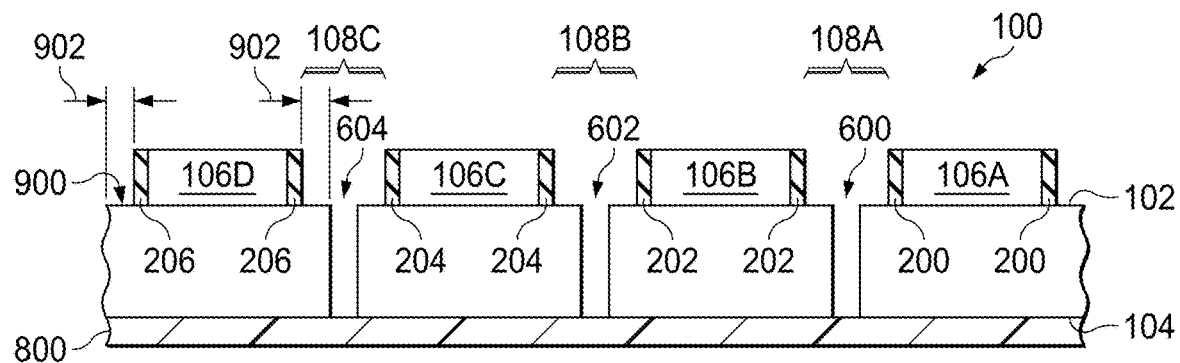
FIG. 9A is a profile cross-sectional view of a tape and test devices being removed from device sides of semiconductor dies in accordance with various examples.
Figure 9B:
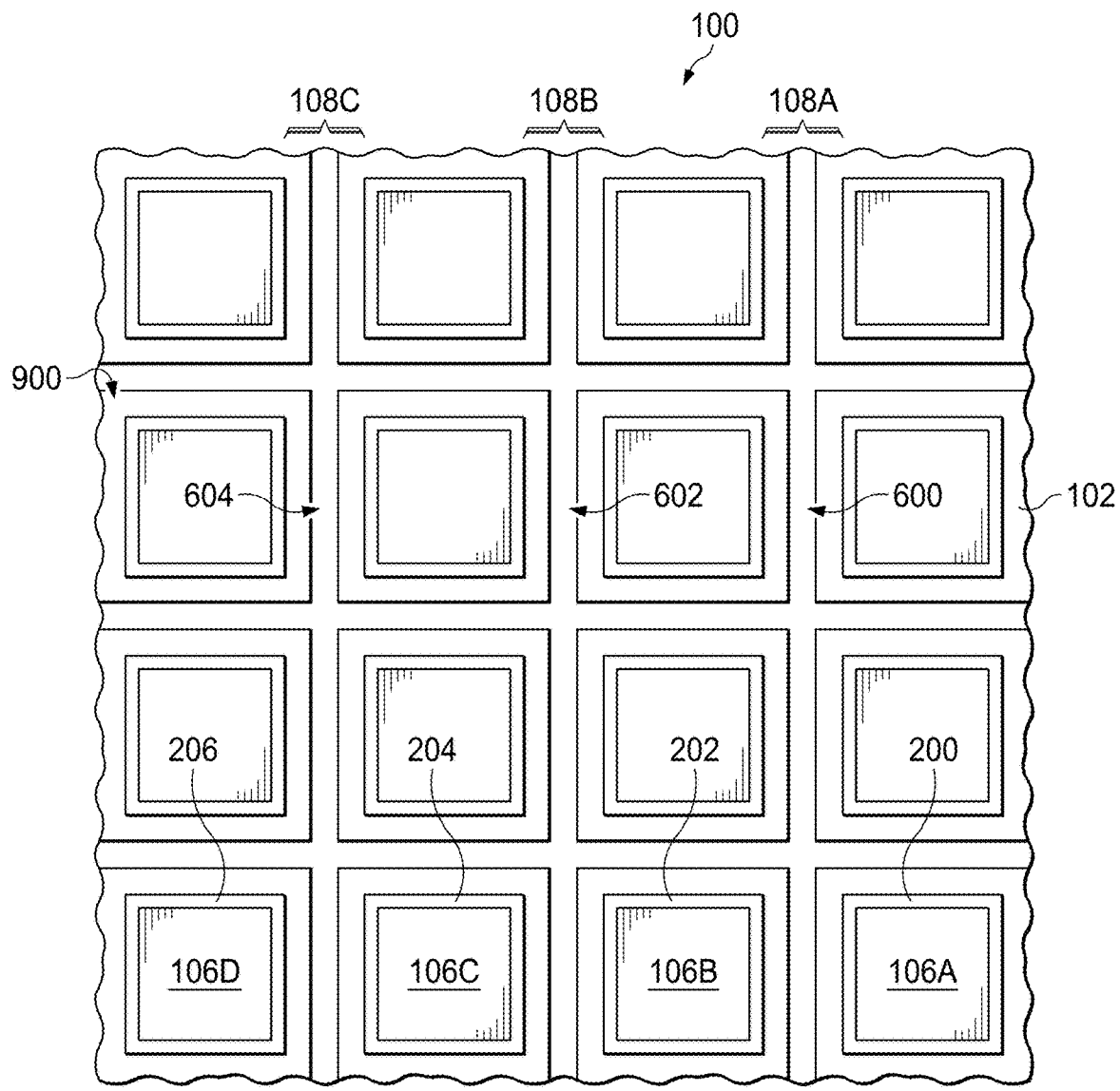
FIG. 9B is a top-down view of a tape and test devices being removed from device sides of semiconductor dies in accordance with various examples.
Figure 9C:
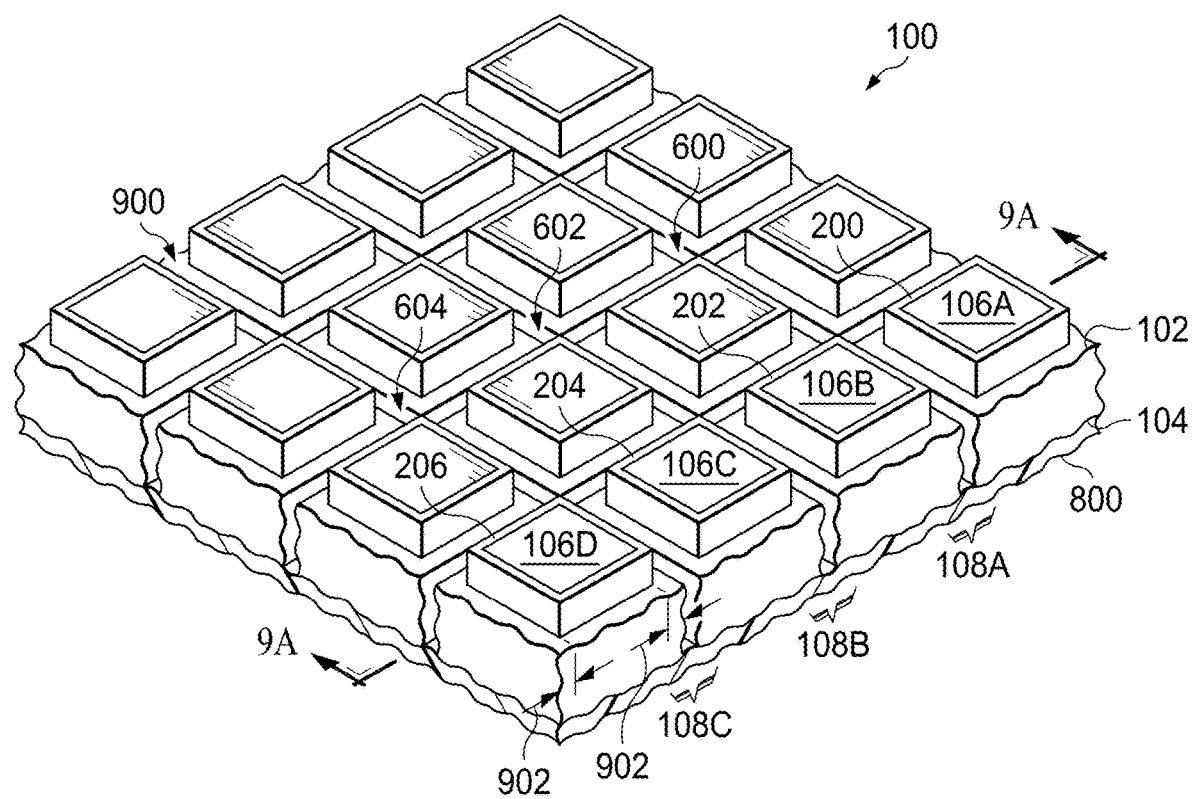
FIG. 9C is a perspective view of a tape and test devices being removed from device sides of semiconductor wafers in accordance with various examples.
Figure 10A:
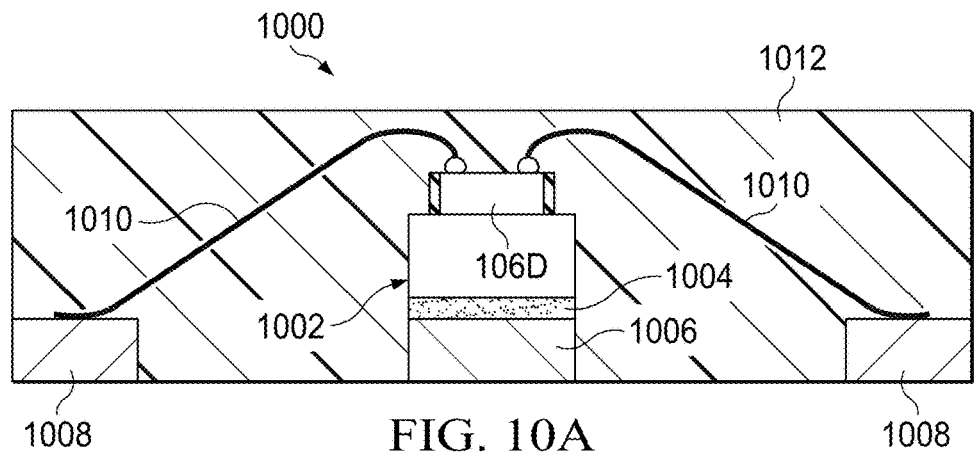
FIG. 10A is a profile cross-sectional view of a semiconductor package having a semiconductor die produced by the wafer dicing techniques described herein, in accordance with various examples.
Figure 10B:
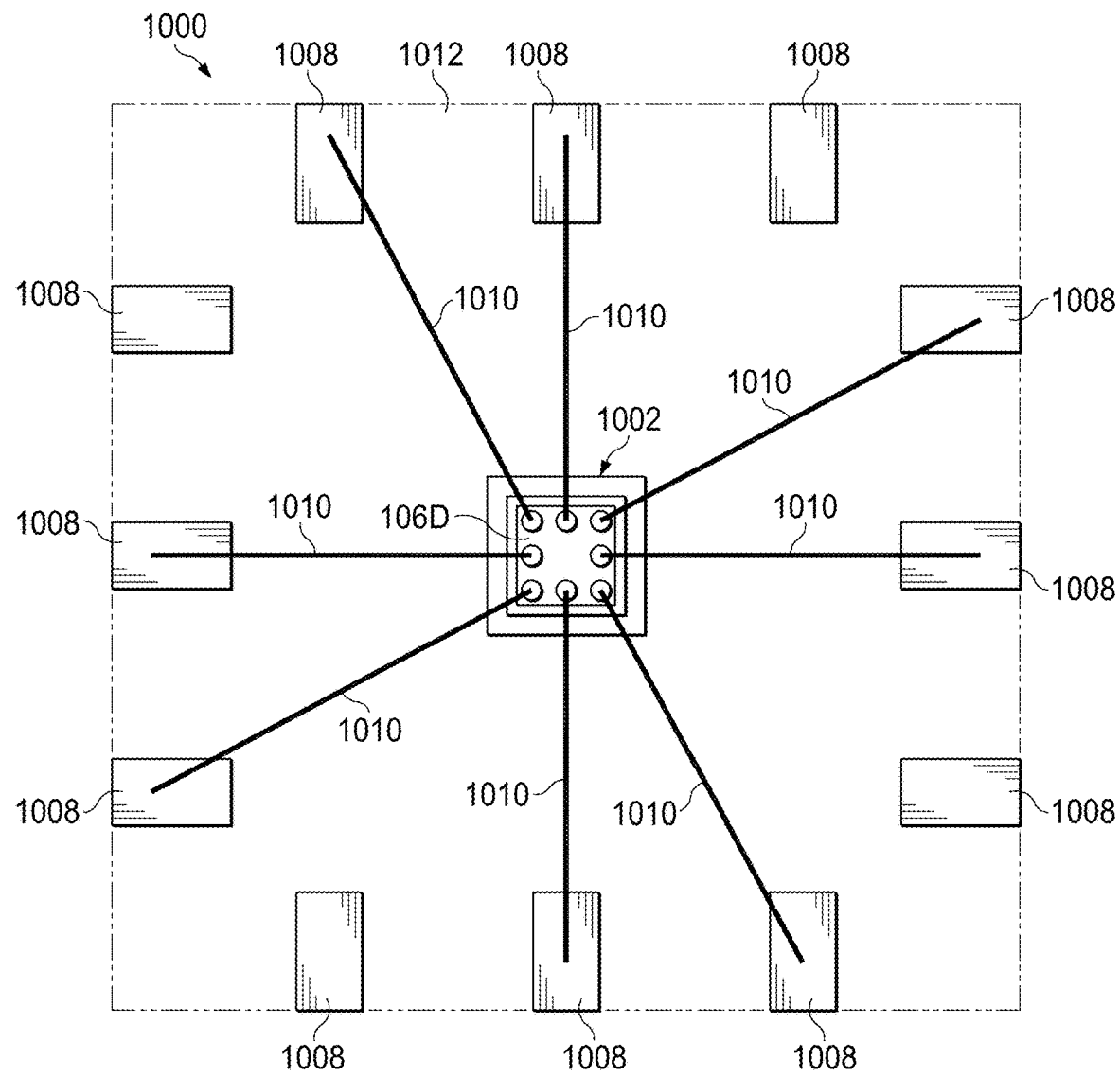
FIG. 10B is a top-down view of a semiconductor package having a semiconductor die produced by the wafer dicing techniques described herein, in accordance with various examples.
Figure 10C:
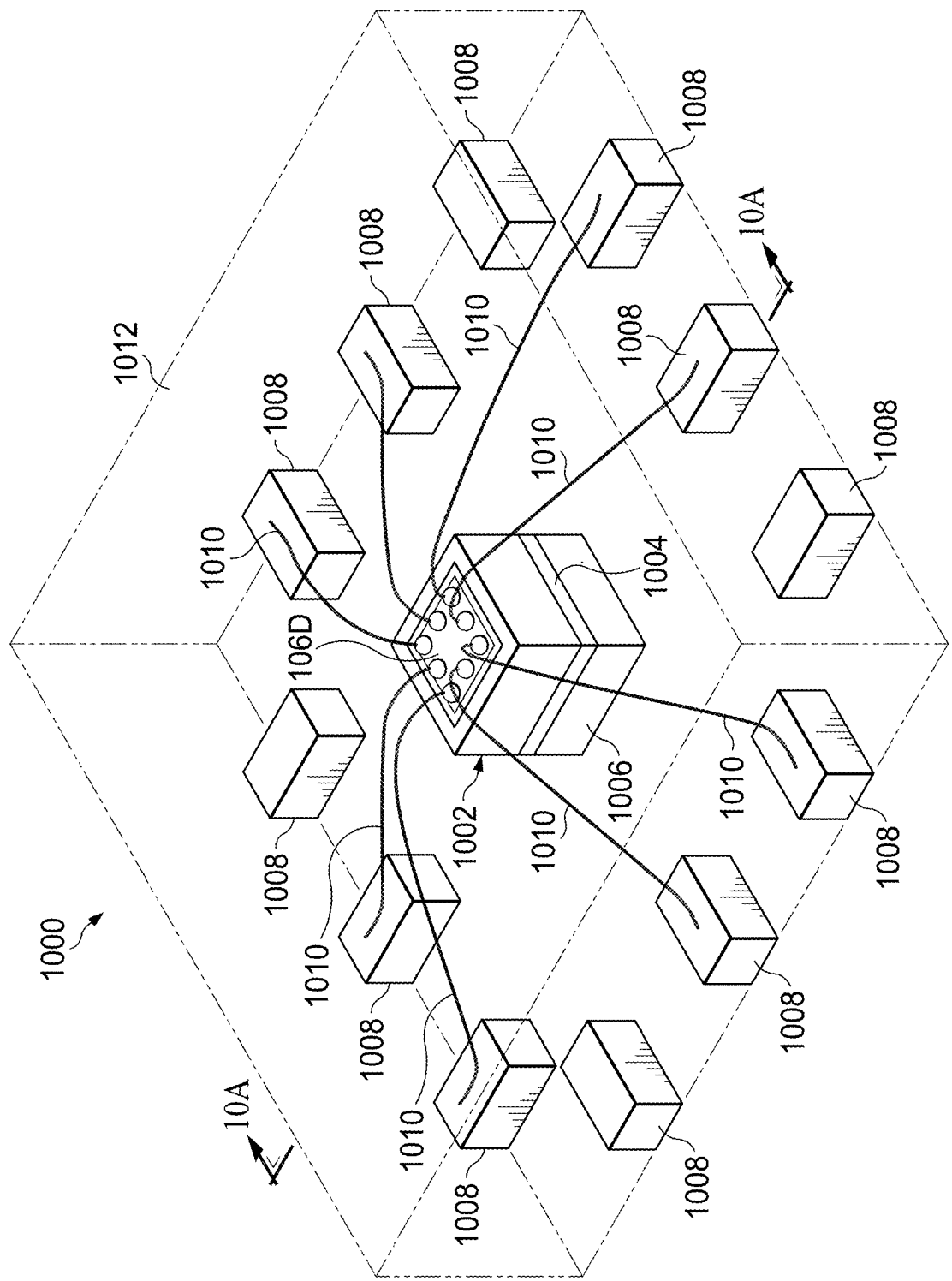
FIG. 10C is a perspective view of a semiconductor package having a semiconductor die produced by the wafer dicing techniques described herein, in accordance with various examples.
Figure 11:
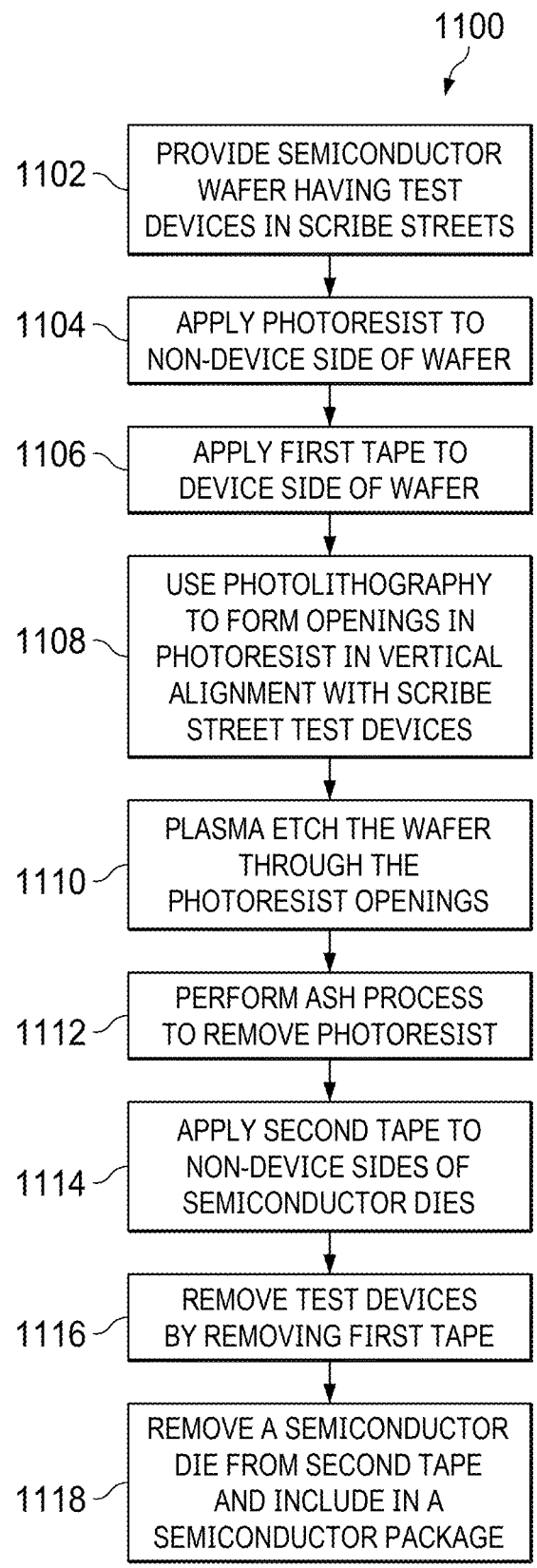
FIG. 11 is a flow diagram of a method for performing a wafer dicing technique in accordance with various examples.

FIGS. 1A-10C are a process flow demonstrating the efficient removal of test devices from scribe streets during semiconductor wafer dicing. FIG. 11 is a flow diagram of a method 1100 for the efficient removal of test devices from scribe streets during semiconductor wafer dicing. Accordingly, the method 1100 of FIG. 11 is now described in parallel with the process flow of FIGS. 1A-10C.

Figure 1B:
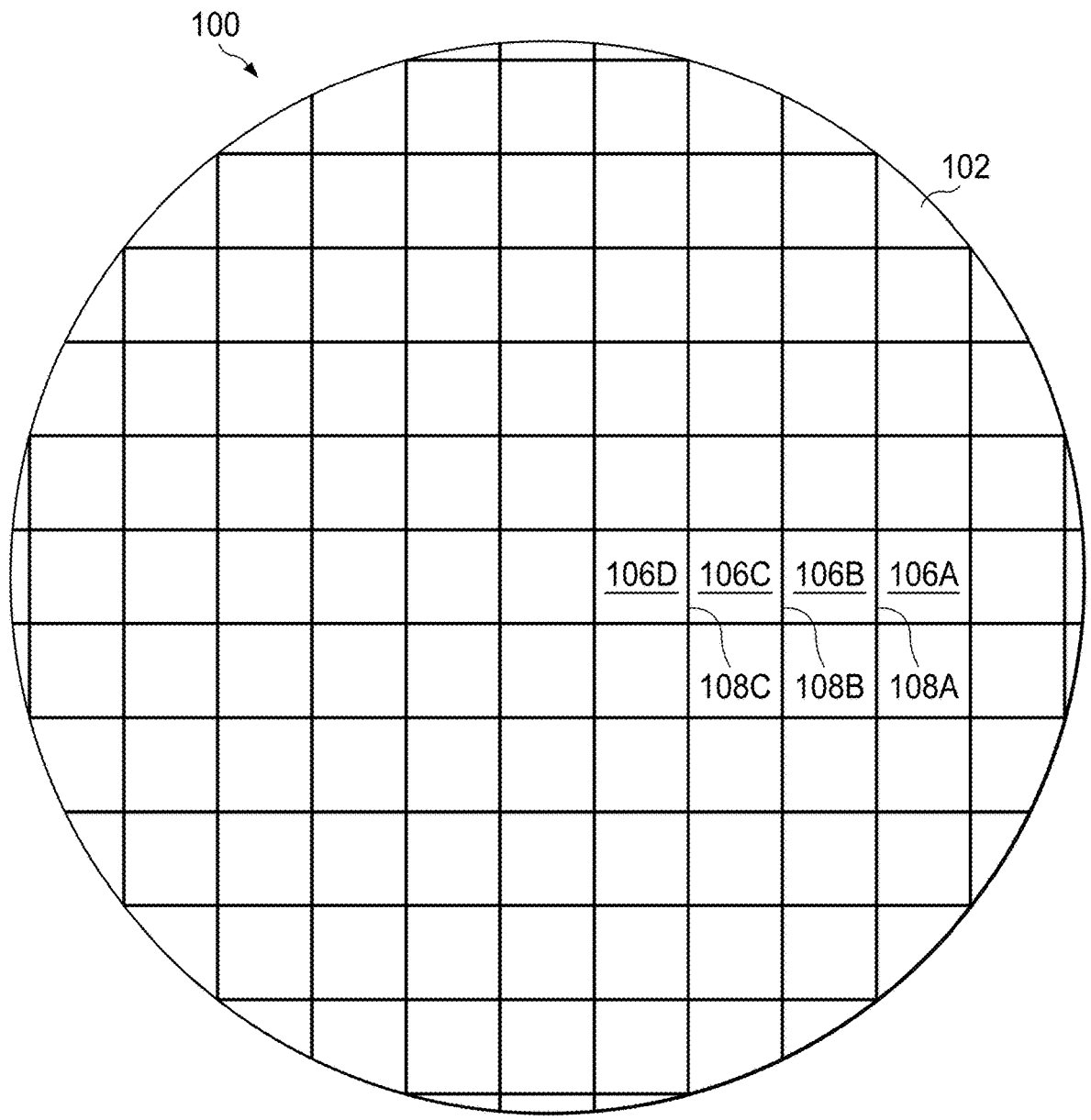
FIG. 1B is a top-down view of a semiconductor wafer having scribe streets, in accordance with various examples.

The method 1100 begins with providing a semiconductor wafer having test devices in scribe streets (1102). FIG. 1A is a perspective view of a semiconductor wafer 100 having scribe streets, in accordance with various examples. The wafer 100 may be a silicon wafer or a gallium nitride wafer, for example. The wafer 100 includes a device side 102 and a non-device side 104. Circuits are formed in and on the device side 102, while no circuits are formed in or on the non-device side 104. For example, the device side 102 includes circuits 106A-106D. The various circuits on the device side 102 are separated from each other by scribe streets useful for dicing the wafer 100. For example, the circuits 106A and 106B are separated by a scribe street 108A. Similarly, a scribe street 108B separates circuits 106B and 106C, and a scribe street 108C separates circuits 106C and 106D. Each of the scribe streets on the wafer 100 has a width ranging from 5 microns to 10 microns, with a width less than this range being disadvantageous because the plasma etch variance will make it difficult to precisely control etching separation and etch speed will be greatly reduced, and with a width greater than this range being disadvantageous because it causes an increase in unusable design area and substantially increases costs. In addition, scribe seals (not expressly shown in FIG. 1A but shown in other figures as described below) may circumscribe circuits, such as circuits 106A-106D, and the scribe seals may be positioned between the circuits and the scribe streets that circumscribe the circuits. Stated another way, the scribe streets may circumscribe the scribe seals, and the scribe seals may circumscribe the circuits. Further, although not expressly shown in FIG. 1A (but shown in other figures as described below), test devices useful for testing circuits on the device side 102 of the wafer 100 may be included in the scribe streets. FIG. 1B is a top-down view of the wafer 100, in accordance with various examples.

Figure 2A:
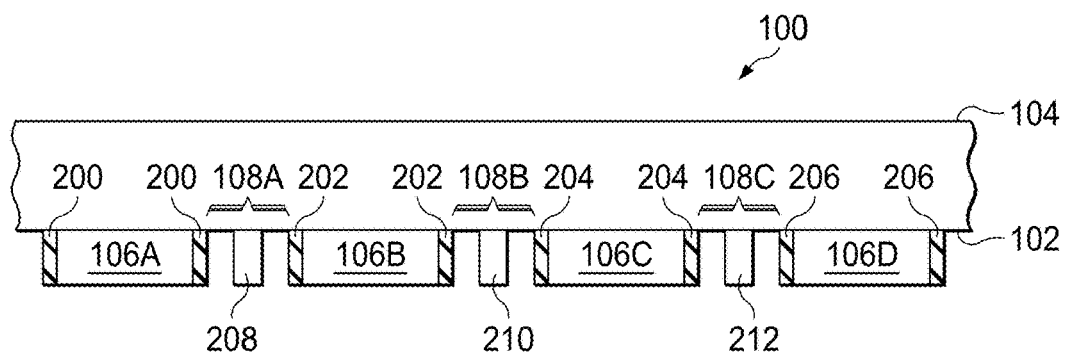
FIG. 2A is a profile cross-sectional view of a semiconductor wafer having test devices in scribe streets, in accordance with various examples.
Figure 2B:
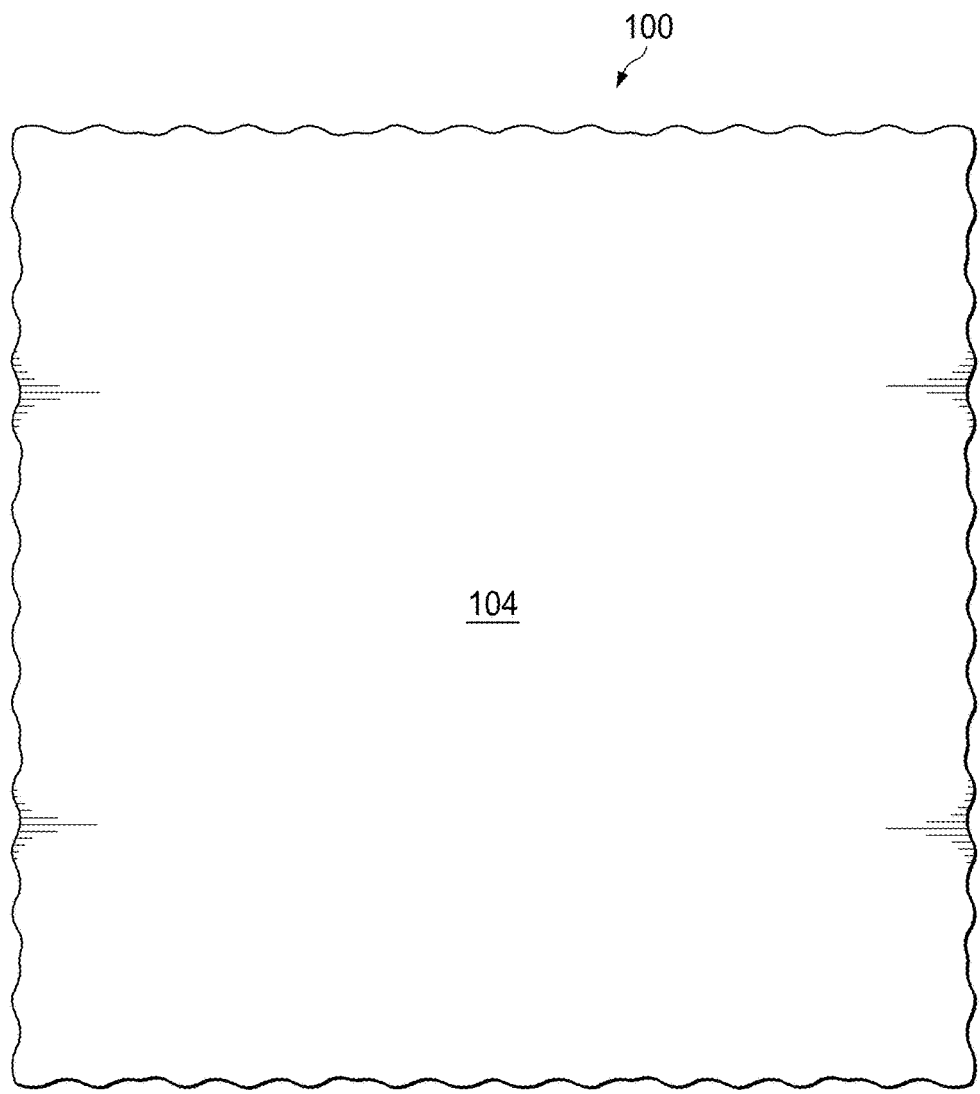
FIG. 2B is a top-down view of a semiconductor wafer having test devices in scribe streets, in accordance with various examples.
Figure 2C:
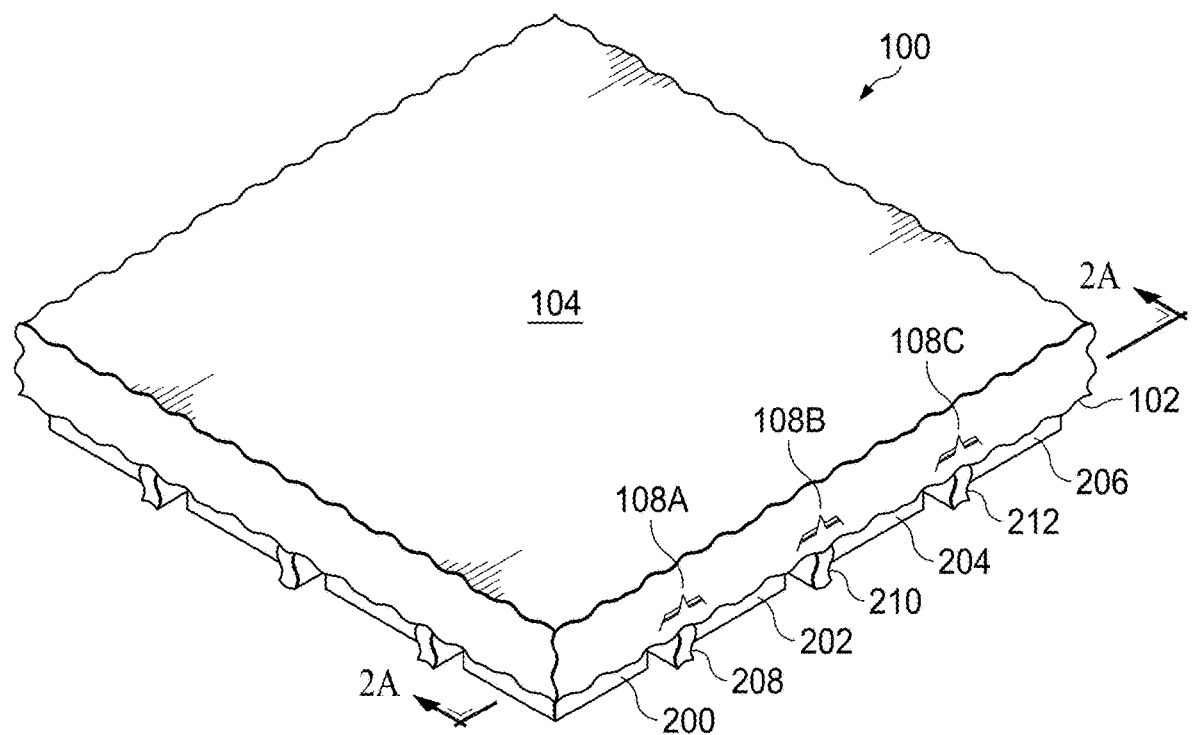
FIG. 2C is a perspective view of a semiconductor wafer having test devices in scribe streets, in accordance with various examples.

FIG. 2A is a profile cross-sectional view of a semiconductor wafer 100 having test devices in scribe streets, in accordance with various examples. More particularly, FIG. 2A shows only a portion of the wafer 100 (for clarity and ease of explanation) oriented such that the device side 102 is facing downward and the non-device side 104 is facing upward. As described above, the scribe street 108A separates the circuits 106A and 106B from each other. The scribe street 108B separates the circuits 106B and 106C from each other. The scribe street 108C separates the circuits 106C and 106D from each other. Further, FIG. 2A depicts a scribe seal 200 circumscribing the circuit 106A. Because FIG. 2A is a profile cross-sectional view, scribe seal 200 appears on both the left and right sides of the circuit 106A. Likewise, a scribe seal 202 circumscribes the circuit 106B, a scribe seal 204 circumscribes the circuit 106C, and a scribe seal 206 circumscribes the circuit 106D. Further still, a test device 208, which may be useful for testing the functional integrity of circuits on the wafer 100 (e.g., circuits 106A or 106B), is positioned in the scribe street 108A. Other materials, including various oxide and nitride stacks, also may be positioned in the scribe street 108A and the techniques described herein may be adapted or extended to remove such materials as well, but such additional materials are omitted for clarity of illustration. Similarly, test devices 210 and 212 are positioned in the scribe streets 108B and 108C, respectively, and other materials may also be positioned in these streets but are omitted from the drawings for ease of illustration. In examples, the test devices 208, 210, and 212 are centered or are approximately centered in the scribe streets 108A, 108B, and 108C, respectively. The ratio of the width of a test device (e.g., test devices 208, 210, 212) to the width of the scribe street in which the test device is positioned (e.g., scribe streets 108A, 108B, 108C) ranges from 5 microns to 8 microns with a ratio lower than this range being disadvantageous because it creates a risk of chipping or undercutting of the scribe seal, and with a ratio higher than this range being disadvantageous because it increases die size and results in substantially increased cost. The thickness of the wafer 100 ranges from 40 microns to 190 microns, with a wafer thinner than this range being disadvantageous because it creates a risk for die damage of breakage during the die attach process, and with a wafer thicker than this range being disadvantageous because it will substantially increase processing time during etch, as well as result in an increased aspect ratio that requires wider streets to maintain the etch rate. FIG. 2B is a top-down view of the wafer 100 having test devices in scribe streets, in accordance with various examples. FIG. 2C is a perspective view of a wafer 100 having test devices in scribe streets, in accordance with various examples.

Figure 3A:
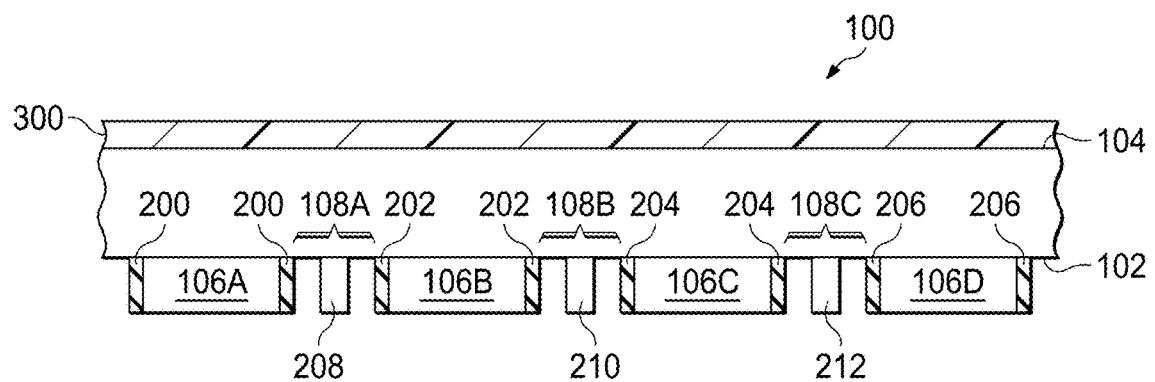
FIG. 3A is a profile cross-sectional view of a semiconductor wafer having test devices in scribe streets and a photoresist layer coupled to a non-device side of the semiconductor wafer, in accordance with various examples.
Figure 3B:
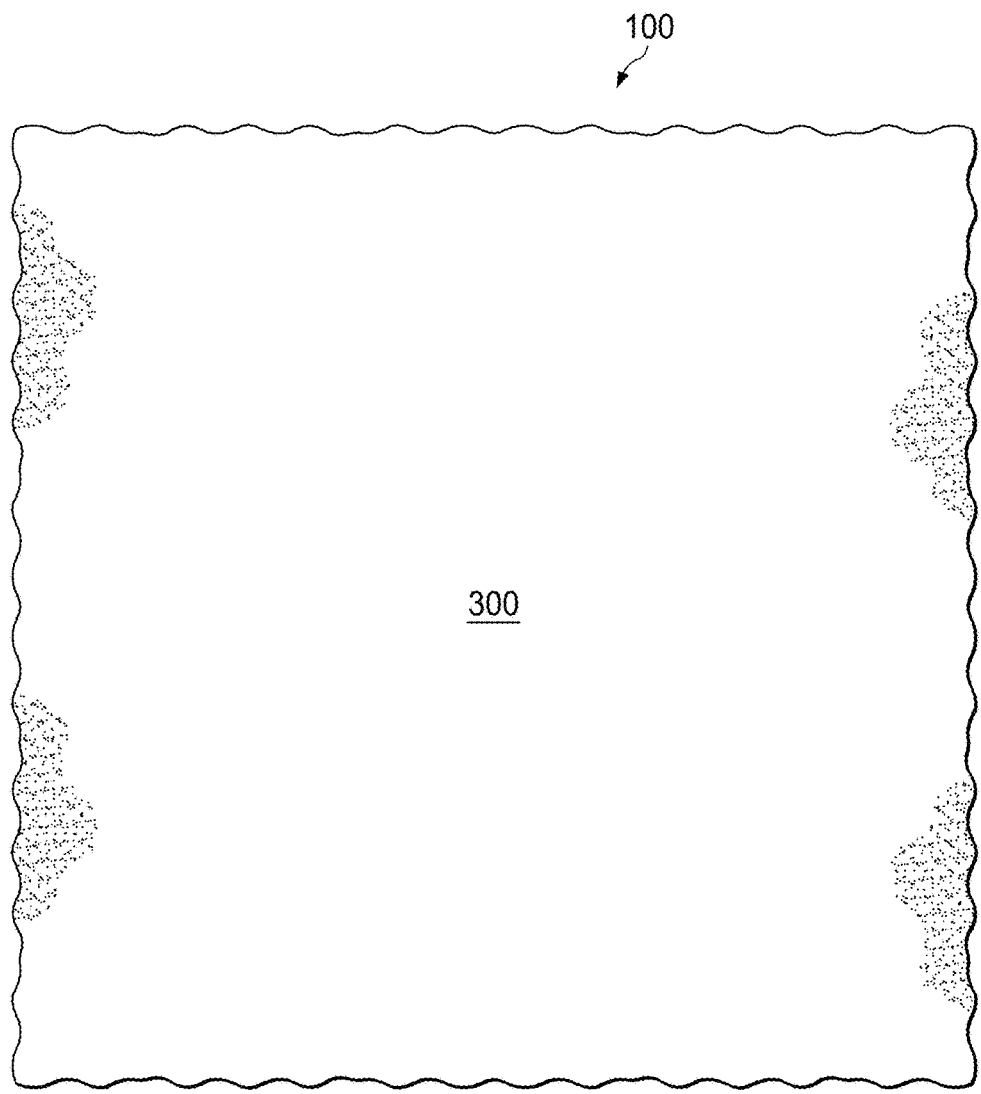
FIG. 3B is a top-down view of a semiconductor wafer having test devices in scribe streets and a photoresist layer coupled to a non-device side of the semiconductor wafer, in accordance with various examples.
Figure 3C:
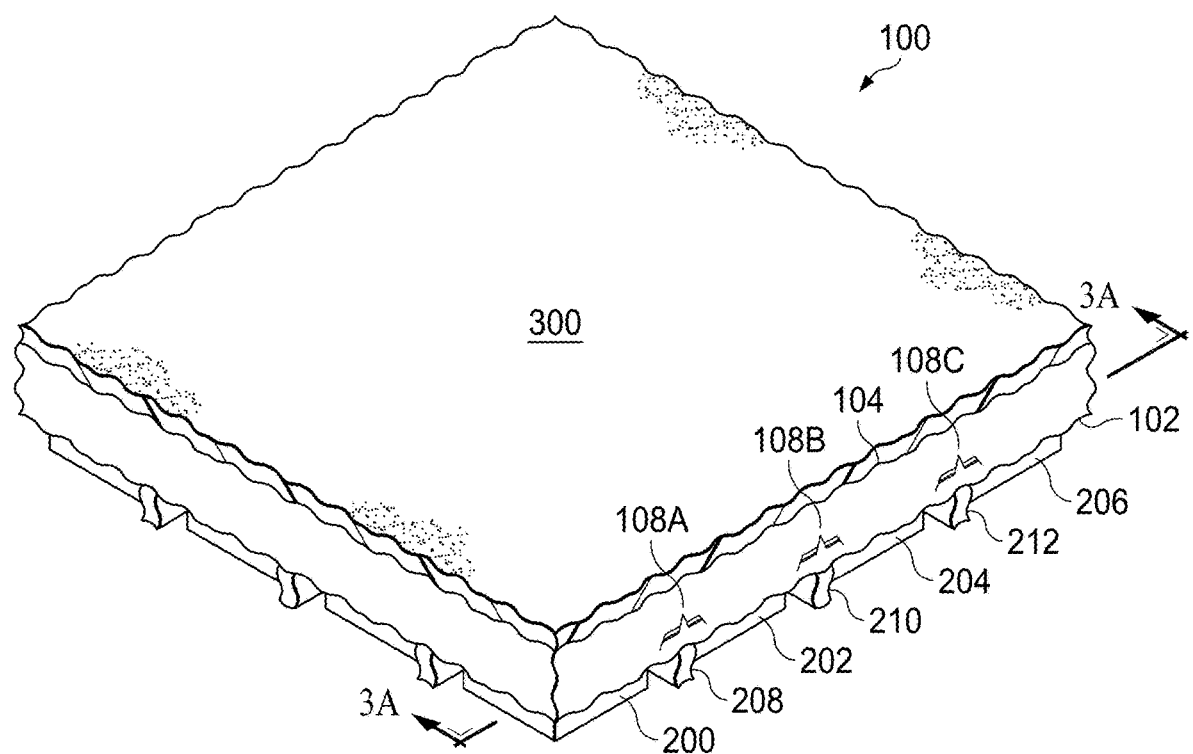
FIG. 3C is a perspective view of a semiconductor wafer having test devices in scribe streets and a photoresist layer coupled to a non-device side of the semiconductor wafer, in accordance with various examples.

The method 1100 further includes applying a layer of photoresist to a non-device side of the wafer (1104). In examples, a polyimide overcoat may be applied in lieu of a photoresist layer. FIG. 3A is a profile cross-sectional view of a semiconductor wafer 100 having test devices in scribe streets and a photoresist layer coupled to a non-device side of the semiconductor wafer, in accordance with various examples. The wafer 100 as shown in FIG. 3A is identical to that shown in FIG. 2A, except for the inclusion of the photoresist layer 300 on the non-device side 104 of the wafer 100. The photoresist layer 300 has a thickness ranging from 2 microns to 17 microns, with a thickness lower than this range being disadvantageous because it can create plasma high voltage arcing risks as breakthrough during etch is possible, thereby decreasing manufacturing yield, and with a thickness above this range being disadvantageous because it leads to longer processing times to remove the photoresist that is not consumed during the etching process. FIG. 3B is a top-down view of the wafer 100 having test devices in scribe streets and a photoresist layer coupled to a non-device side of the semiconductor wafer, in accordance with various examples. FIG. 3C is a perspective view of the wafer 100 having test devices in scribe streets and a photoresist layer coupled to a non-device side of the semiconductor wafer, in accordance with various examples.

Figure 4A:
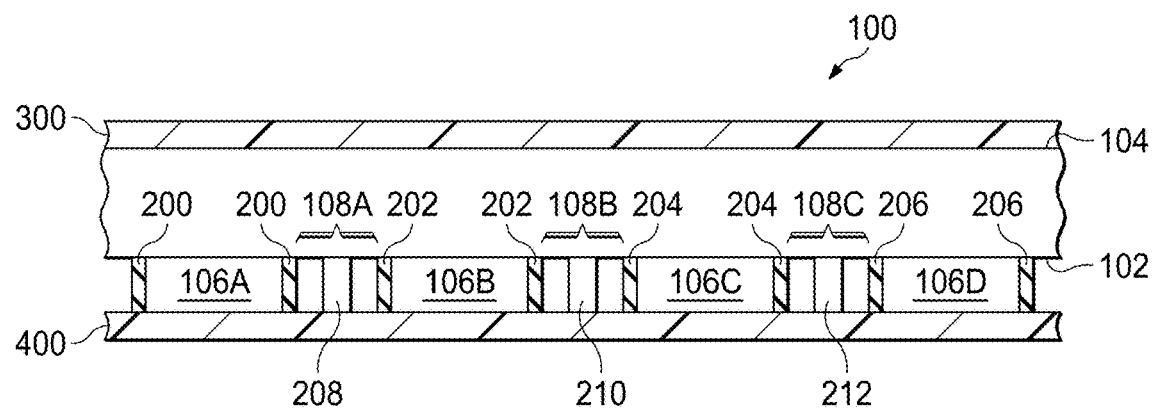
FIG. 4A is a profile cross-sectional view of a semiconductor wafer having a tape coupled to test devices in scribe streets, and a photoresist layer coupled to a non-device side of the semiconductor wafer, in accordance with various examples.
Figure 4B:
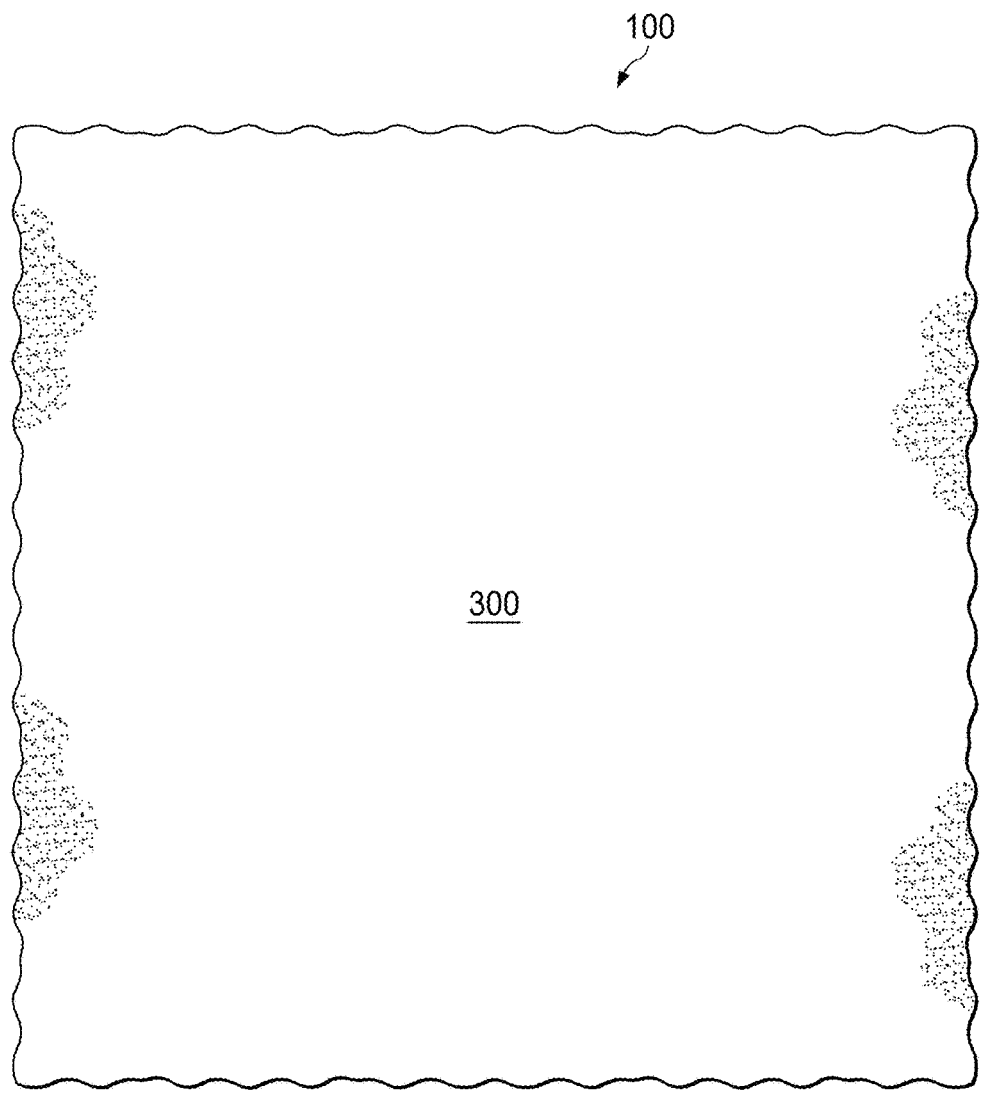
FIG. 4B is a top-down view of a semiconductor wafer having a tape coupled to test devices in scribe streets, and a photoresist layer coupled to a non-device side of the semiconductor wafer, in accordance with various examples.
Figure 4C:
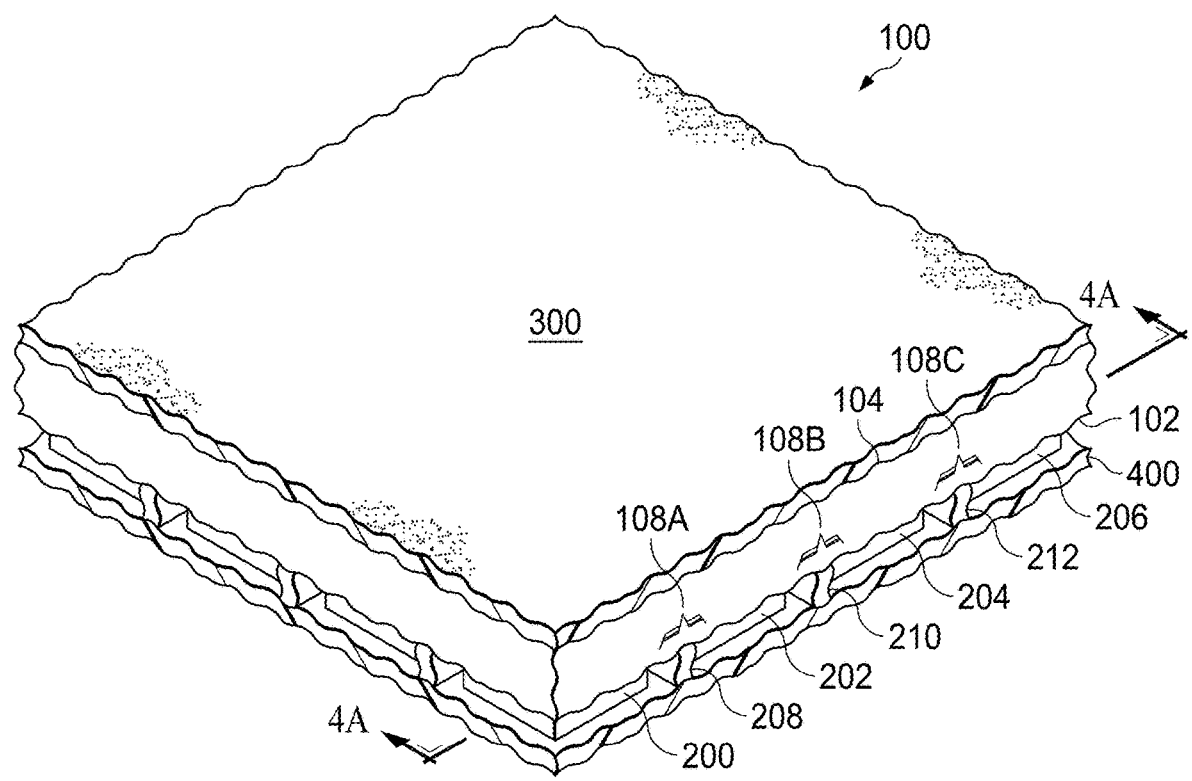
FIG. 4C is a perspective view of a semiconductor wafer having a tape coupled to test devices in scribe streets, and a photoresist layer coupled to a non-device side of the semiconductor wafer, in accordance with various examples.

The method 1100 subsequently includes applying a first tape to the device side of the wafer (1106). FIG. 4A is a profile cross-sectional view of the wafer 100 having a tape coupled to test devices in scribe streets, and a photoresist layer coupled to a non-device side of the semiconductor wafer, in accordance with various examples. The structure of FIG. 4A is identical to that of FIG. 3A, except for the addition of a tape 400 to the device side 102 of the wafer 100. The tape 400 contacts the circuits 106A-106D, the scribe seals 200, 202, 204, and 206, and the test devices 208, 210, and 212. The tape 400 may be mounted on a frame in some examples, such as a stretchable (e.g., flex) frame. The tape 400 is a polyolefin tape of any thickness. Silicon-based tapes cannot be used due to etch damage. The tape 400 may have specific properties that enable the subsequent removal of the test devices 208, 210, and 212 as described below. Such properties may include adhesive properties and post-ultraviolet releasable adhesive strength. Specifically, the adhesive will retain some adhesion level after ultraviolet release, and thus the die will be easily removed, while smaller remnants will remain on the adhesive. FIG. 4B is a top-down view of the wafer 100 having a tape coupled to test devices in scribe streets, and a photoresist layer coupled to a non-device side of the semiconductor wafer, in accordance with examples. FIG. 4C is a perspective view of the wafer 100 having a tape coupled to test devices in scribe streets, and a photoresist layer coupled to a non-device side of the semiconductor wafer, in accordance with examples.

Figure 5A:
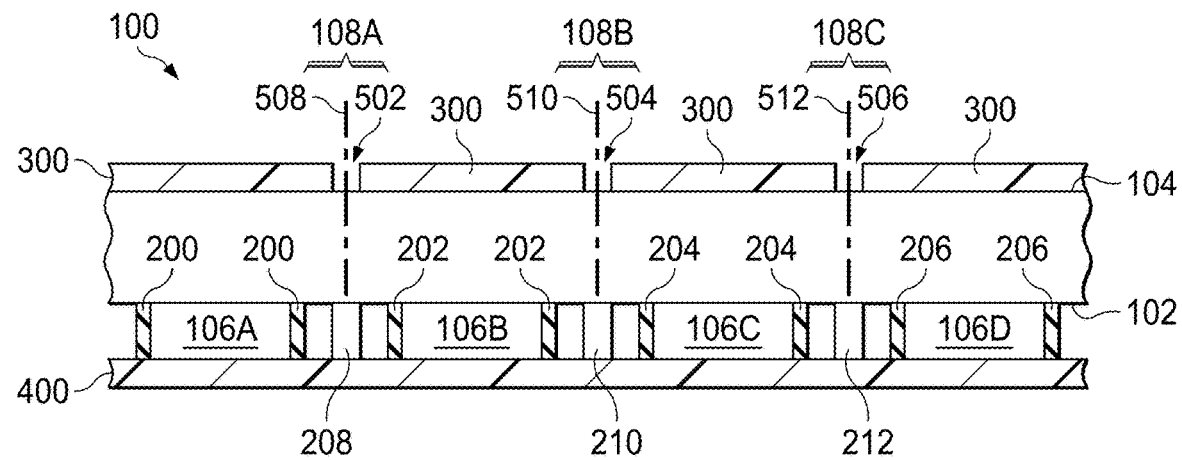
FIG. 5A is a profile cross-sectional view of a semiconductor wafer having a photolithographic process performed to a photoresist layer coupled to a non-device side of the semiconductor wafer, in accordance with various examples.
Figure 5B:
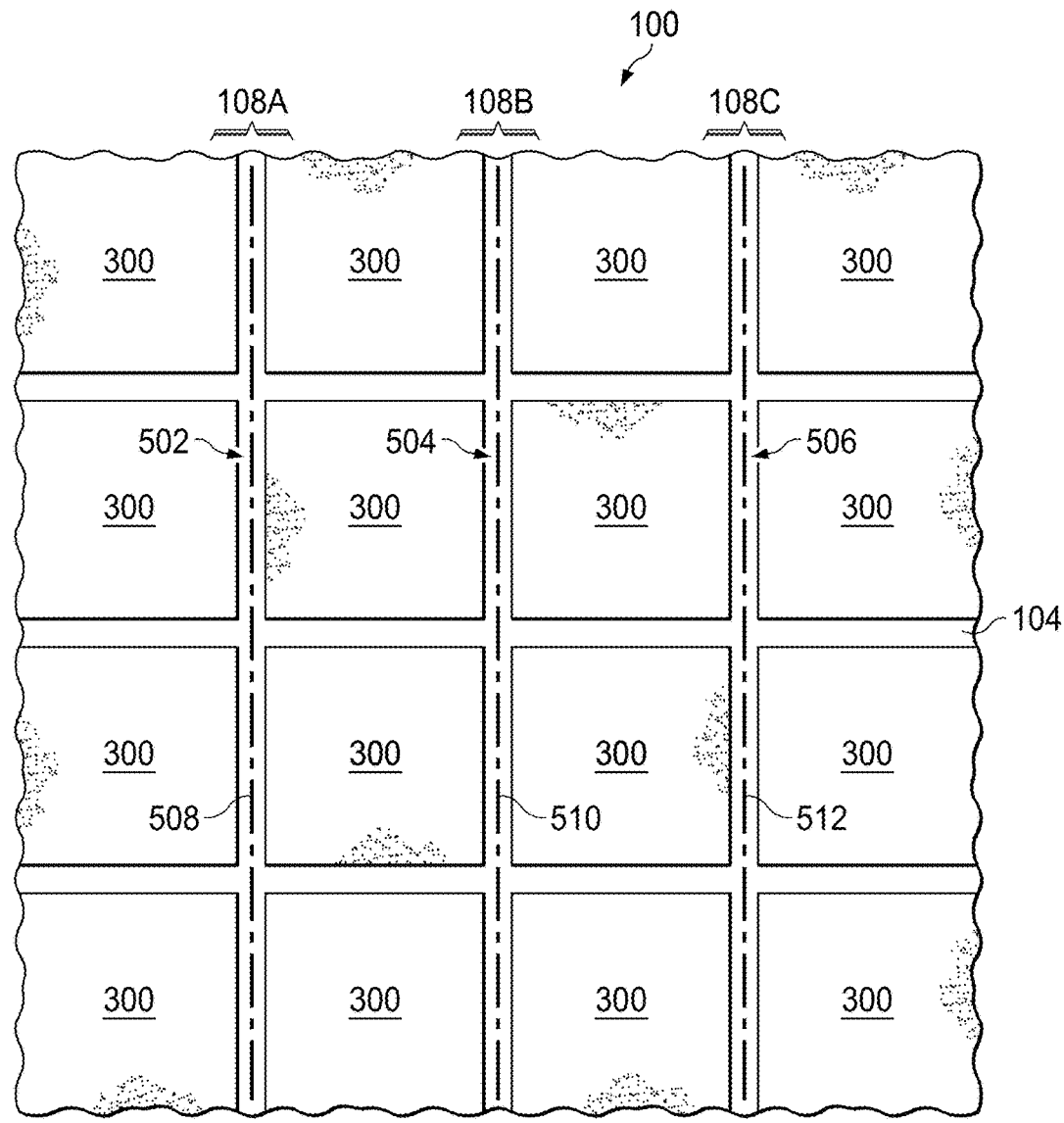
FIG. 5B is a top-down view of a semiconductor wafer having a photolithographic process performed to a photoresist layer coupled to a non-device side of the semiconductor wafer, in accordance with various examples.
Figure 5C:
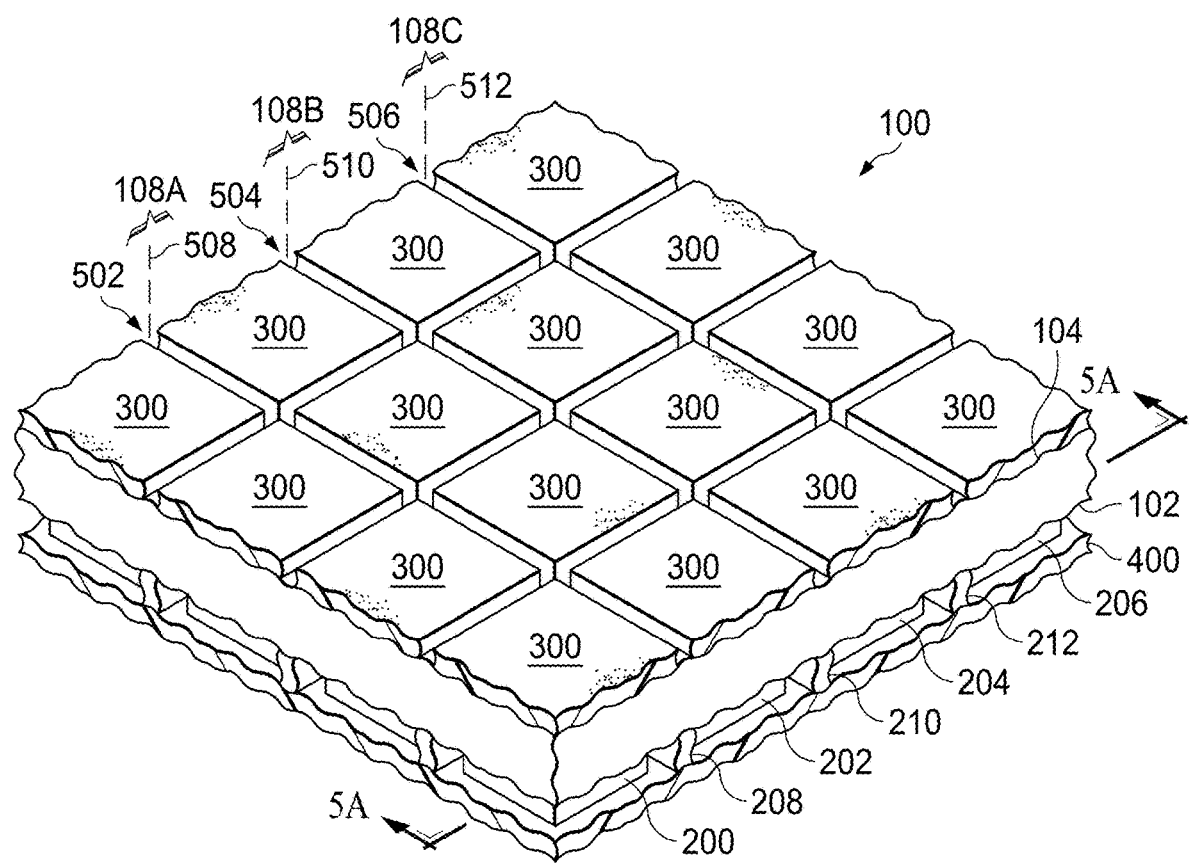
FIG. 5C is a perspective view of a semiconductor wafer having a photolithographic process performed to a photoresist layer coupled to a non-device side of the semiconductor wafer, in accordance with various examples.

The method 1100 further includes using photolithography to form openings in the photoresist layer, where the openings are in vertical alignment with the scribe street test devices (1108). FIG. 5A is a profile cross-sectional view of the wafer 100 having a photolithographic process performed to a photoresist layer coupled to a non-device side of the semiconductor wafer, in accordance with various examples. Specifically, photolithographic processes may be useful to form openings 502, 504, and 506 in the photoresist layer 300. The opening 502 is vertically aligned with test device 208, as axis 508 demonstrates. The opening 504 is vertically aligned with test device 210, as axis 510 demonstrates. The opening 506 is vertically aligned with test device 212, as axis 512 demonstrates. The photolithographic processes may include, for instance, the application of a suitable mask, the application of light (e.g., ultraviolet light) through the mask to expose target areas of the photoresist layer 300 in which the openings are to be formed, the application of a suitable chemical to develop the exposed areas of the photoresist layer 300, and the application of a suitable etchant to remove the developed areas of the photoresist layer 300. The widths of the openings 502, 504, and 506, which are determined by the widths of the openings in the mask used during the photolithography process, should be at least as wide as the corresponding test devices 208, 210, and 212. If, for example, the width of the opening 502 is not as wide as the test device 208, the trench formed in the wafer 100 during subsequent etching will be too narrow, and the test device 208 will remain coupled to the wafer 100 at the left and right ends of the test device 208. Consequently, when the tape 400 is later removed, the test device 208 will not be removed along with the tape, but will instead remain attached to the wafer 100. Conversely, the widths of the openings 502, 504, and 506 do not exceed 95% of the width of the corresponding scribe street 108A, 108B, or 108C. If the openings 502, 504, and 506 are wider than this threshold, a significant benefit of this disclosure is negated—namely, when the wafer dicing is complete, the horizontal area of the wafer supporting each circuit and scribe seal will be smaller than the combined horizontal area of the circuit and scribe seal, thereby creating mechanical instability and providing inadequate support for the circuit and scribe seal. A more detailed description of this feature is provided below. FIG. 5B is a top-down view of the semiconductor wafer 100 having a photolithographic process performed to a photoresist layer coupled to a non-device side of the semiconductor wafer, in accordance with various examples. FIG. 5C is a perspective view of the semiconductor wafer 100 having a photolithographic process performed to a photoresist layer coupled to a non-device side of the semiconductor wafer, in accordance with various examples.

Figure 6A:
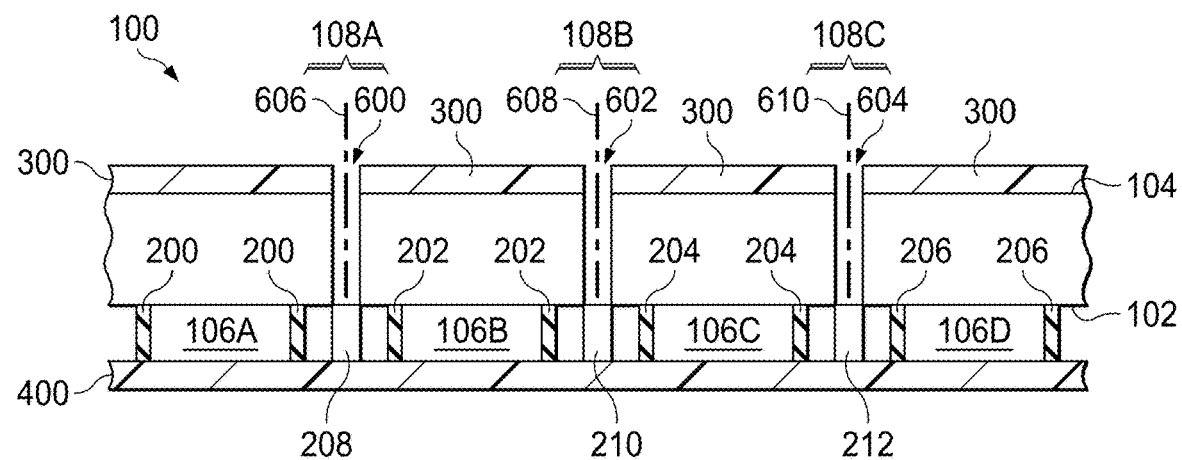
FIG. 6A is a profile cross-sectional view of a semiconductor wafer being plasma etched in accordance with various examples.
Figure 6B:
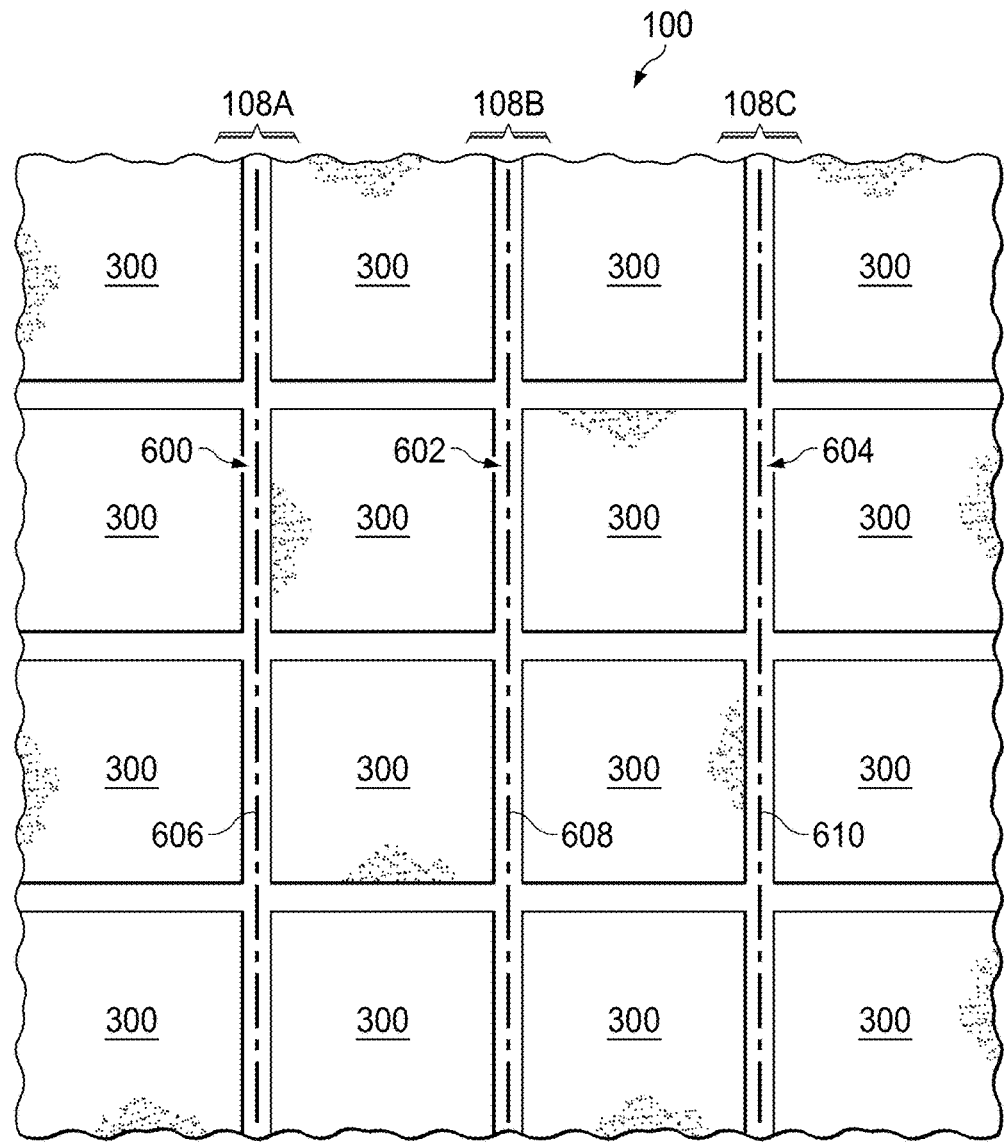
FIG. 6B is a top-down view of a semiconductor wafer being plasma etched in accordance with various examples.
Figure 6C:
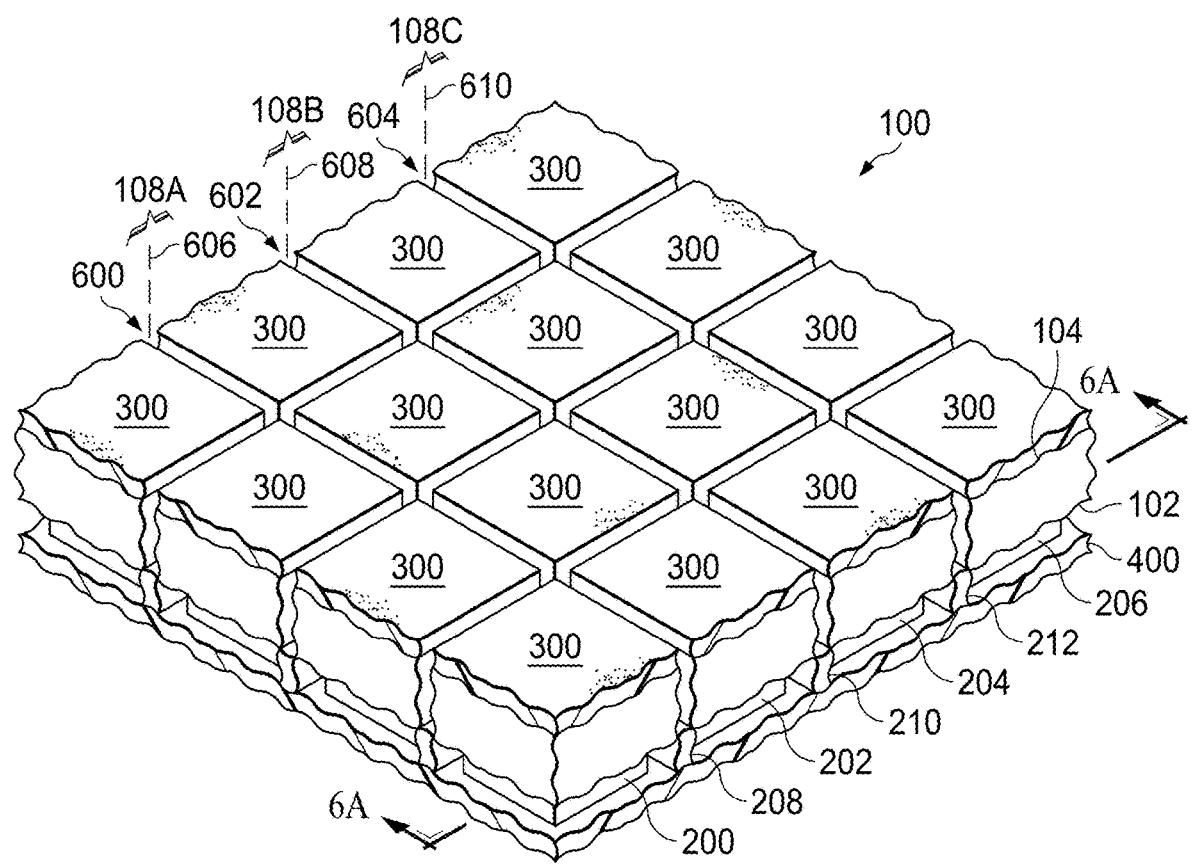
FIG. 6C is a perspective view of a semiconductor wafer being plasma etched in accordance with various examples.

The method 1100 includes plasma etching the wafer through the openings in the photoresist layer (1110). FIG. 6A is a profile cross-sectional view of the semiconductor wafer 100 being plasma etched in accordance with various examples. The plasma etching process produces multiple vertical etch trenches in the wafer 100. As shown, the wafer 100 includes a vertical etch trench 600 in the wafer 100 in vertical alignment with opening 502 and the test device 208, as axis 606 shows. Similarly, the wafer 100 includes a vertical etch trench 602 in the wafer 100 in vertical alignment with opening 504 and the test device 210, as axis 608 shows. Likewise, the wafer 100 includes a vertical etch trench 604 in the wafer 100 in vertical alignment with opening 506 and the test device 212, as axis 610 shows. In examples, a plasma etching technique is used to form the vertical etch trenches 600, 602, and 604. Settings critical for plasma etching the vertical etch trenches 600, 602, and 604 include the sulfur hexafluoride (SF6) and octafluorostyrene (C8F8) gas controls (i.e., Bosch etch process). These two gases and etch times control the verticality of the sidewall as well as scallop size during dicing. SF6 is to etch and C8F8 is used for deposition etch protection to remain vertical. In examples, plasma etching in the wafer 100 includes monitoring the rate at which ions, such as fluorine ions, are released from the semiconductor material of the wafer 100 as the etching is performed. A change in this release rate that exceeds a threshold indicates that the etching is complete and that no semiconductor material remains to be etched, i.e., a test device has been reached. The widths of the trenches 600, 602, and 604 range from 5 microns to 20 microns, with a trench wider than this range being disadvantageous because it requires more design space and large chip sizes, and with a trench narrower than this range being disadvantageous because it slows the etch rate and increases processing time. Other etches, including oxide and nitride etches, may be performed as may be suitable to remove oxide and nitride materials. FIG. 6B is a top-down view of the semiconductor wafer 100 being plasma etched in accordance with various examples. FIG. 6C is a perspective view of the semiconductor wafer 100 being plasma etched in accordance with various examples.

Figure 7A:
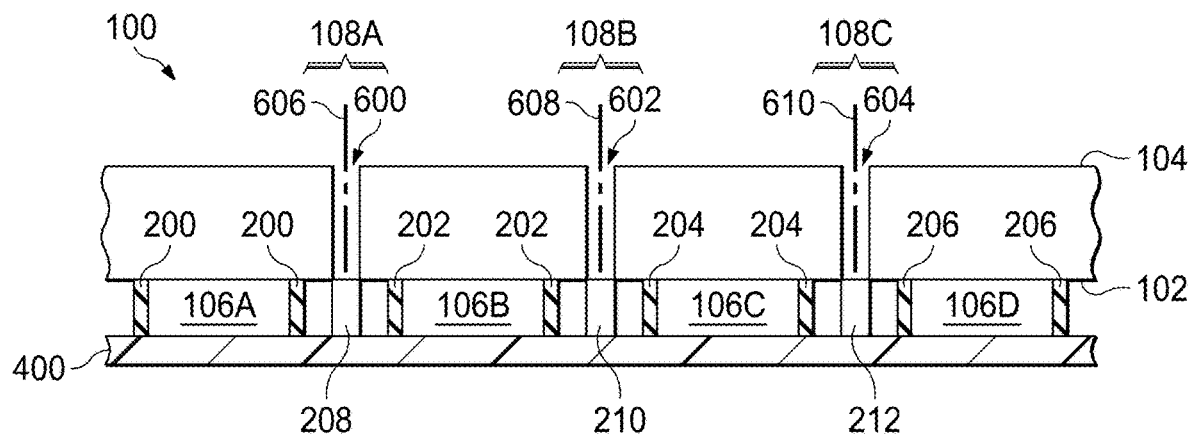
FIG. 7A is a profile cross-sectional view of an ash process being performed to remove a photoresist layer from semiconductor dies in accordance with various examples.
Figure 7B:
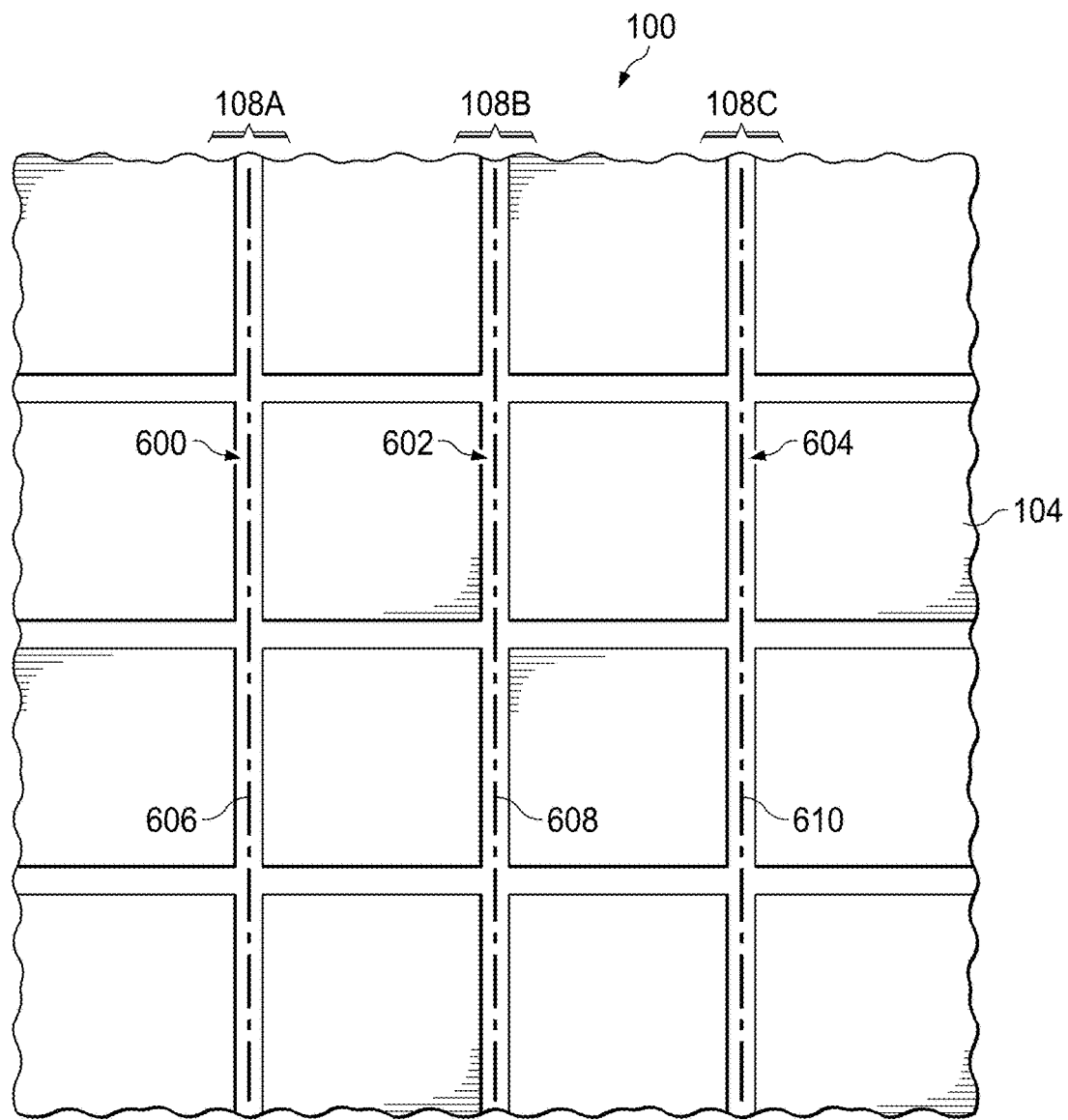
FIG. 7B is a top-down view of an ash process being performed to remove a photoresist layer from semiconductor dies in accordance with various examples.
Figure 7C:
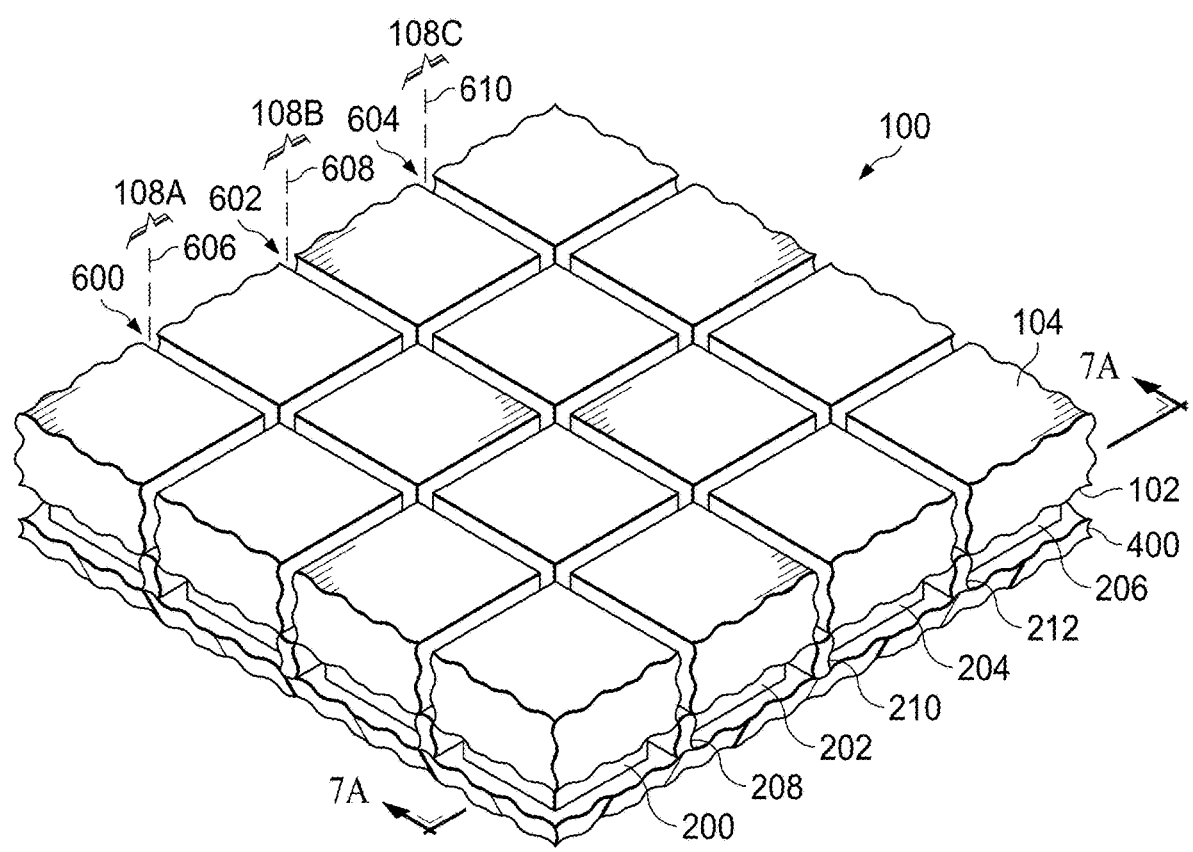
FIG. 7C is a perspective view of an ash process being performed to remove a photoresist layer from semiconductor dies in accordance with various examples.

The method 1100 includes performing an ash process to remove the photoresist layer(s) and to remove ions, such as fluorine ions, generated by the plasma etching process described above (1112). FIG. 7A is a profile cross-sectional view of an ash process being performed to remove the photoresist layers 300 from the semiconductor dies in accordance with various examples. FIG. 7B is a top-down view of an ash process being performed to remove the photoresist layers 300 from semiconductor dies in accordance with various examples. FIG. 7C is a perspective view of an ash process being performed to remove the photoresist layer 300 from semiconductor dies in accordance with various examples.

Figure 8A:
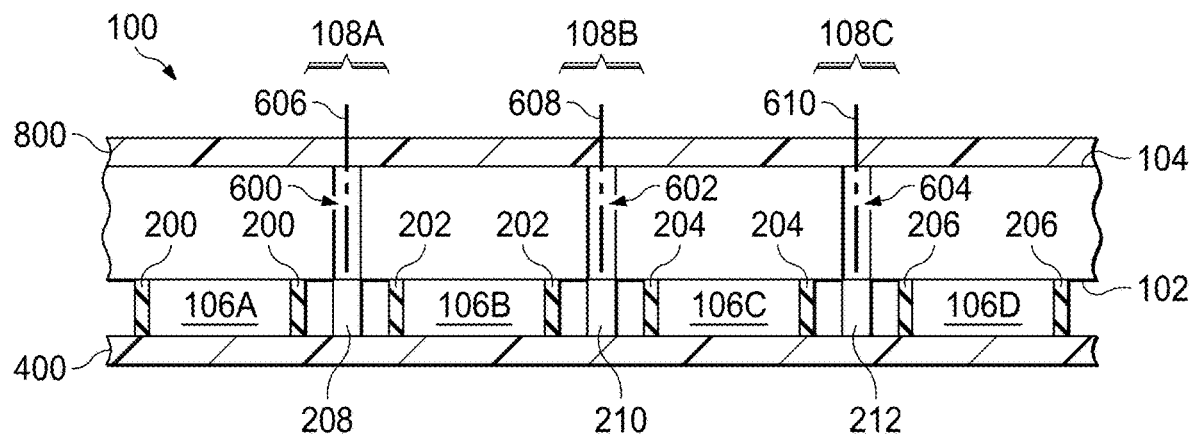
FIG. 8A is a profile cross-sectional view of a tape being applied to non-device sides of semiconductor dies in accordance with various examples.
Figure 8B:
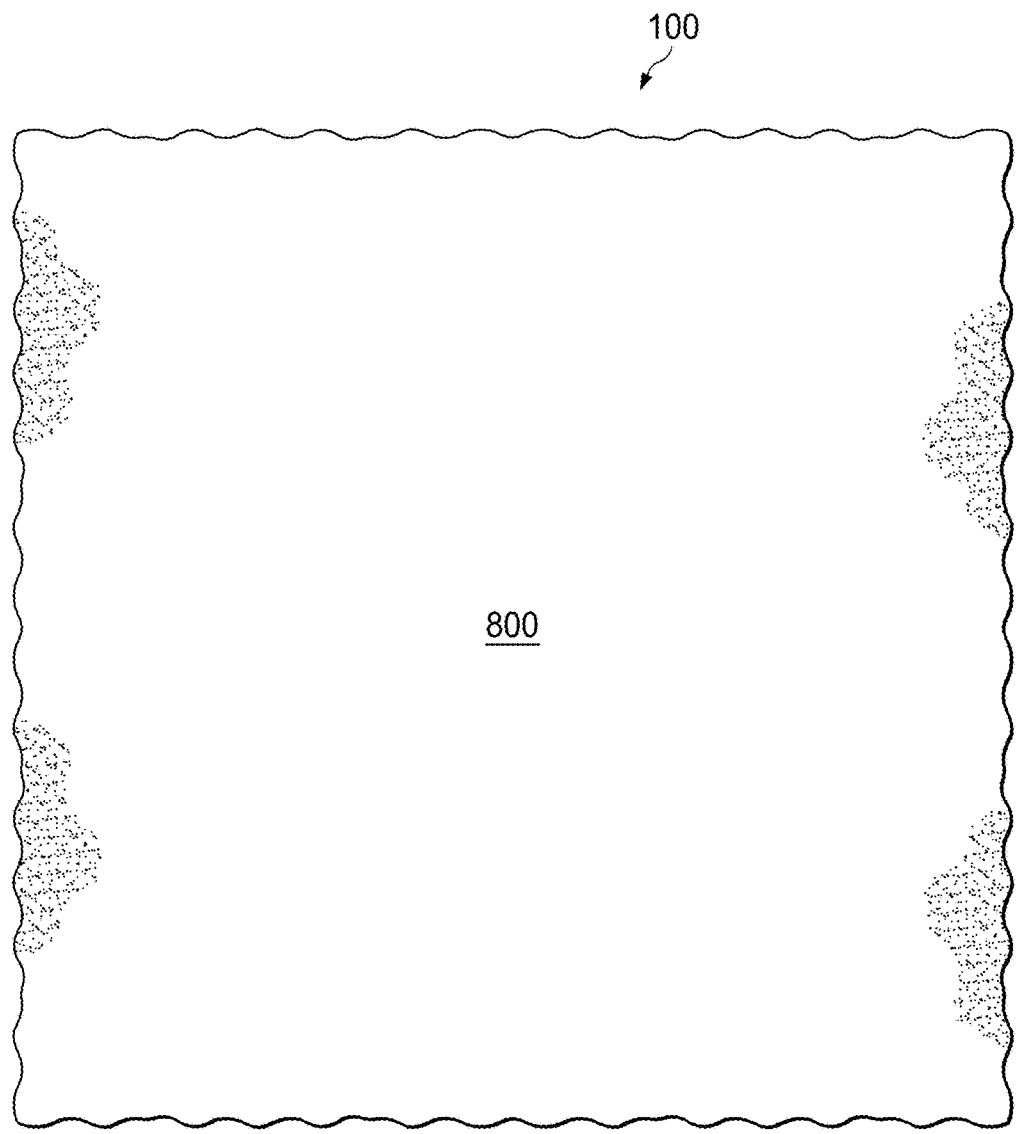
FIG. 8B is a top-down view of a tape being applied to non-device sides of semiconductor dies in accordance with various examples.
Figure 8C:
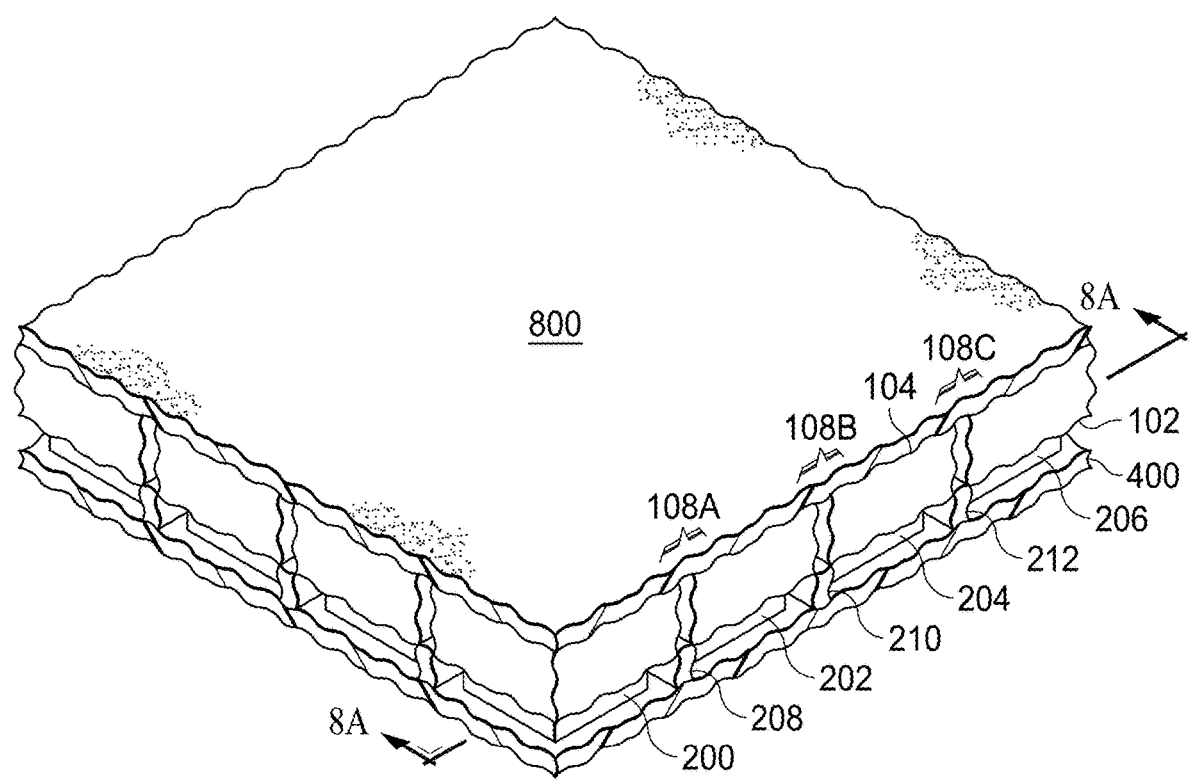
FIG. 8C is a perspective view of a tape being applied to non-device sides of semiconductor dies in accordance with various examples.

The method 1100 includes applying a second tape to the non-device sides of the semiconductor dies (1114). FIG. 8A is a profile cross-sectional view of a tape 800 being applied to non-device sides 104 of the semiconductor dies in accordance with various examples. The tape 800 may be applied with the aid of a flex frame or other suitable frame. FIG. 8B is a top-down view of the tape 800 being applied to the non-device sides 104 of the semiconductor dies in accordance with various examples. FIG. 8C is a perspective view of the tape 800 being applied to the non-device sides 104 of the semiconductor dies in accordance with various examples.

The method 1100 subsequently comprises removing the test devices by removing the first tape (1116). FIG. 9A is a profile cross-sectional view of the tape 400 and test devices 208, 210, and 212 being removed from device sides of semiconductor dies in accordance with various examples. FIG. 9B is a top-down view of the tape 400 and test devices 208, 210, and 212 being removed from device sides of semiconductor dies in accordance with various examples. FIG. 9C is a perspective view of the tape 400 and test devices 208, 210, and 212 being removed from device sides of semiconductor wafers in accordance with various examples.

As described above, because the widths of the vertical etch trenches 600, 602, and 604 were sufficiently wide, after the plasma etching is complete, the test devices 208, 210, and 212 are no longer attached to the semiconductor dies. Rather, the test devices 208, 210, and 212 are held in place only by the tape 400. Accordingly, when the tape 400 is removed, the test devices 208, 210, and 212 are removed with the tape 400. Further, as described above, because the vertical etch trenches 600, 602, and 604 are not wider than 90% of the width of their corresponding scribe streets 108A, 108B, and 108C, a ring of the device side of each semiconductor die circumscribes the scribe seal of that die, and the scribe seal of that die circumscribes the circuit of that die. For example, in a top-down view, a ring 900 circumscribes scribe seal 206, which, in turn, circumscribes the circuit 106D. The width 902 of the ring 900 between the scribe seal 206 (e.g., a vertical plane coincident with the scribe seal 206) and an edge of the device side 102 is determined at least in part by the width of the vertical etch trench 604 relative to the width of the scribe street. The width 902 ranges from 2 microns to 5 microns, with a width smaller than this range being disadvantageous because it requires slower etch times at the oxide and nitride level of the etch, and with a width greater than this range being disadvantageous because it necessitates more design space and increased costs.

The method 1100 includes removing a semiconductor die from the second tape and including the semiconductor die in a semiconductor package (1118). FIG. 10A is a profile cross-sectional view of a semiconductor package 1000 having a semiconductor die 1002 produced by the wafer dicing techniques described herein, in accordance with various examples. The package 1000 is a quad flat no lead (QFN) style package, but other types of packages, such as dual inline packages (DIP), also may include semiconductor dies produced using the wafer dicing techniques described herein. The package 1000 includes the semiconductor die 1002, a die attach layer 1004 coupled to the die 1002, and a thermal pad 1006 coupled to the die attach layer 1004. The circuit 106D is coupled to conductive terminals 1008 by way of bond wires 1010. A mold compound 1012 covers the various structures of the example package 1000. FIG. 10B is a top-down view of the semiconductor package 1000. FIG. 10C is a perspective view of the semiconductor package 1000.

Unless otherwise stated, "about," "approximately," or "substantially" preceding a value means+/−10 percent of the stated value. Modifications are possible in the described examples, and other examples are possible within the scope of the claims.

What is claimed is:

1. A method for manufacturing a semiconductor package, comprising:
    coupling a photoresist layer to a non-device side of a semiconductor wafer, the semiconductor wafer having a device side, first and second circuits formed in the device side and separated by a scribe street, a test device positioned in the scribe street;
    coupling a tape to the device side of the semiconductor wafer;
    performing a photolithographic process to form an opening in the photoresist layer;
    plasma etching through the semiconductor wafer by way of the opening in the photoresist layer to produce first and second semiconductor dies having the first and second circuits, respectively;
    removing the tape from device sides of the first and second semiconductor dies, wherein removing the tape includes removing the test device;
    coupling the first circuit of the first semiconductor die to a conductive member; and
    covering the first semiconductor die with a mold compound, the conductive member exposed to an exterior surface of the mold compound, wherein a width of the opening is same as a width of the test device.

2. The method of claim 1, wherein the opening is vertically aligned with the test device.

3. The method of claim 1, further comprising performing an ash process to remove the photoresist layer.

4. The method of claim 3, further comprising coupling a second tape to non-device sides of the first and second semiconductor dies.

5. The method of claim 1, wherein plasma etching through the semiconductor wafer includes monitoring a rate of release of fluorine ions for a change that exceeds a threshold.

6. The method of claim 1, wherein a width of an etch trench in the semiconductor wafer is no greater than 95% of a width of the scribe street.

7. The method of claim 1, wherein a ring circumscribing a scribe seal of the first semiconductor die has a width ranging from 2 microns to 3 microns.

8. The method of claim 1, further comprising coupling the first semiconductor die to a thermal pad via a die attach material.

9. A method for manufacturing a semiconductor package, comprising:
    coupling a photoresist layer to a non-device side of a semiconductor wafer, the semiconductor wafer having a device side, first and second circuits formed in the device side and separated by a scribe street, a test device positioned in the scribe street;
    coupling a tape to the device side of the semiconductor wafer;
    forming an opening in the photoresist layer;
    plasma etching a trench in the semiconductor wafer by way of the opening in the photoresist layer to produce a semiconductor die having the first circuit, the trench being narrower than the scribe street;
    removing the tape such that the test device is removed with the tape; and
    coupling the first circuit to a conductive member and covering the first circuit with a mold compound such that the conductive member is exposed to an exterior surface of the mold compound,
    wherein a width of the trench is same as a width of the test device.

10. The method of claim 9, further comprising performing an ash process to remove the photoresist layer and fluorine ions from the semiconductor die.

11. The method of claim 9, wherein the opening and the trench are vertically aligned with the scribe street.

12. The method of claim 9, wherein the opening and the trench are vertically aligned with the test device.

13. The method of claim 9, wherein plasma etching the trench in the semiconductor wafer includes monitoring a rate of release of fluorine ions for a change that exceeds a threshold.

14. The method of claim 9, wherein the trench has a width ranging from 5 microns to 20 microns.

15. The method of claim 9, further comprising coupling the semiconductor die to a thermal pad via a die attach material.

\* \* \* \* \*